(12) United States Patent
Nobayashi

(10) Patent No.: US 10,900,770 B2
(45) Date of Patent: Jan. 26, 2021

(54) DISTANCE MEASURING DEVICE, IMAGING APPARATUS, MOVING DEVICE, ROBOT DEVICE, AND RECORDING MEDIUM

(71) Applicant: CANON KABUSHIKI KAISHA, Tokyo (JP)

(72) Inventor: Kazuya Nobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/353,573

(22) Filed: Mar. 14, 2019

(65) Prior Publication Data

US 2019/0301852 A1   Oct. 3, 2019

(30) Foreign Application Priority Data

Mar. 27, 2018   (JP) .................................. 2018-059938

(51) Int. Cl.
*G01B 11/02* (2006.01)
*G01S 17/08* (2006.01)

(52) U.S. Cl.
CPC ............ *G01B 11/026* (2013.01); *G01S 17/08* (2013.01)

(58) Field of Classification Search
CPC ......... G01B 11/026; G01S 17/08; G02B 5/20; G06F 9/3004; H01L 27/14605; H01L 27/14621
See application file for complete search history.

(56) References Cited

U.S. PATENT DOCUMENTS

| 9,456,119 | B2 | 9/2016 | Hamano | |
| 2018/0010903 | A1* | 1/2018 | Takao | .................. G01S 7/4814 |
| 2018/0136477 | A1* | 5/2018 | Moriuchi | ................ G06T 7/571 |

FOREIGN PATENT DOCUMENTS

JP          5917207 B      5/2016

* cited by examiner

*Primary Examiner* — Steven Whitesell Gordon
(74) *Attorney, Agent, or Firm* — Carter, DeLuca & Farrell LLP

(57) ABSTRACT

A distance measuring device includes an imaging optical system having an optical filter and an imaging element in which a plurality of pixel portions is arranged. The optical filter is divided into three regions, the first region has a first spectral transmittance characteristic, and the second region and the third region a second spectral transmittance characteristic in which light having a longer wavelength compared to the first spectral transmittance characteristic is transmitted. The first pixel portion that configures the imaging element includes a first photoelectric conversion unit and receives light that has passing through the first region. The second pixel portion that configures the imaging element includes second and third photoelectric conversion units, and receives light that has passed through each of the second region and the third region. A distance information acquiring unit acquires distance information corresponding to parallax of image data based on each of the output signals from the second and third photoelectric conversion units.

9 Claims, 14 Drawing Sheets

DISTANCE MEASURING DEVICE, IMAGING APPARATUS, MOVING DEVICE, ROBOT DEVICE, AND RECORDING MEDIUM

BACKGROUND OF THE INVENTION

Field of the Invention

The present invention relates to a distance measuring technique using an imaging plane phase difference method.

Description of the Related Art

A distance measuring device is mounted on a moving member, for example, a vehicle, a drone, or a robot, and measures a distance between the moving member and its surroundings or obstacles in order to support action. In particular, in order to avoid collision with obstacles or to support action directed at the tracking of a specified object, a recognition process using an image is required, and an imaging apparatus is used for performing distance measurement.

Japanese Patent No. 5917207 discloses an imaging apparatus using an imaging plane phase difference method, which can acquire not only an image to be used for the recognition process but also a distance. In the imaging plane phase difference distance measuring method, two image data based on an optical image generated by a light flux that has passed through different pupil regions of an imaging optical system is acquired. A relative positional deviation amount between images (referred to as a "parallax amount") is detected by using a method similar to the parallax amount detection method in a stereo imaging apparatus, and the parallax amount can be converted into a defocus amount by using a predetermined conversion coefficient. The defocus amount can be converted into information about distance to an object by using an image-forming relation of the imaging optical system. The captured object image can be acquired as a composite image of two images, or as one of the images. In action support of the moving member, the recognition of the surrounding environment is possible by using the image information and the distance information acquired by using the imaging plane phase difference method.

One factor in an error of the distance information acquired by the imaging plane phase difference distance measuring method is due to a noise included in the image used for calculating a parallax amount. Even in objects having the same distance, the distance information varies due to a noise depending on the timing for acquiring the distance information. If an amount of received light of a photoelectric conversion unit that configures each pixel portion of the imaging element is small, the influence of noise increases, and consequently, the reproducibility of the distance information may decrease. In order to improve the reproducibility of the distance information, it is desirable that each pixel portion of the imaging element can receive light in a wide wavelength band.

Additionally, another factor related to an error of the distance information is chromatic aberration of the imaging optical system provided in the imaging apparatus. Since the imaging optical system forms an optical image of the object on the imaging element, an error due to axial chromatic aberration of the imaging optical system affects the distance information. If the wavelength band pertaining to each pixel portion of the imaging element is wide, an error may occur in the distance information due to the chromatic aberration of the imaging optical system.

In order to recognize the surrounding environment by using a distance measuring device with a more convenient process and with higher accuracy, it is necessary that the color reproducibility of the image used for the recognition process is high and the error of the distance information is low. If the color reproducibility is low, there is a concern about the erroneous recognition of the surrounding environment and the reduction in the visibility of images. Therefore, receiving light in a visible wavelength band in the imaging element is desirable.

SUMMARY OF THE INVENTION

According to the present invention, an image having high color reproducibility is obtained by a distance measuring device and error in the distance information is reduced.

A distance measuring device according to one embodiment of the present invention comprises an optical filter having a plurality of regions that have different spectral transmittance characteristics; a first photoelectric conversion unit configured to be provided in a first pixel portion that configures an imaging element and second and third photoelectric conversion units configured to be provided in a second pixel portion that configures the imaging element; and at least one processor and memory holding a program that makes the processor function as: an acquiring unit configured to acquire distance information corresponding to the parallax of image data based on signals output from each of the second and third photoelectric conversion units, wherein the optical filter has a first region having a first spectral transmittance characteristic and a second region and a third region having a second spectral transmittance characteristic in which light having a longer wavelength compared to the first spectral transmittance characteristic is transmitted, and wherein the first photoelectric conversion unit receives light that has passed through the first region and performs photoelectric conversion and the second and third photoelectric conversion units receive light that has passed through the second and third regions and perform photoelectric conversion.

Further features of the present invention will become apparent from the following description of exemplary embodiments with reference to the attached drawings.

DESCRIPTION OF THE EMBODIMENTS

Embodiments of the present invention will be described in detail below with reference to the drawings. The present invention can be applied to, for example, a distance measuring device, an imaging apparatus, a moving device, and a robot device, which can obtain an image having high color reproducibility and distance information with high accuracy by using the imaging plane phase difference method. Note that the components described in each embodiment are simply examples and the scope of the present invention is not limited to the components described in the following embodiments.

First Embodiment

Figure 1A:
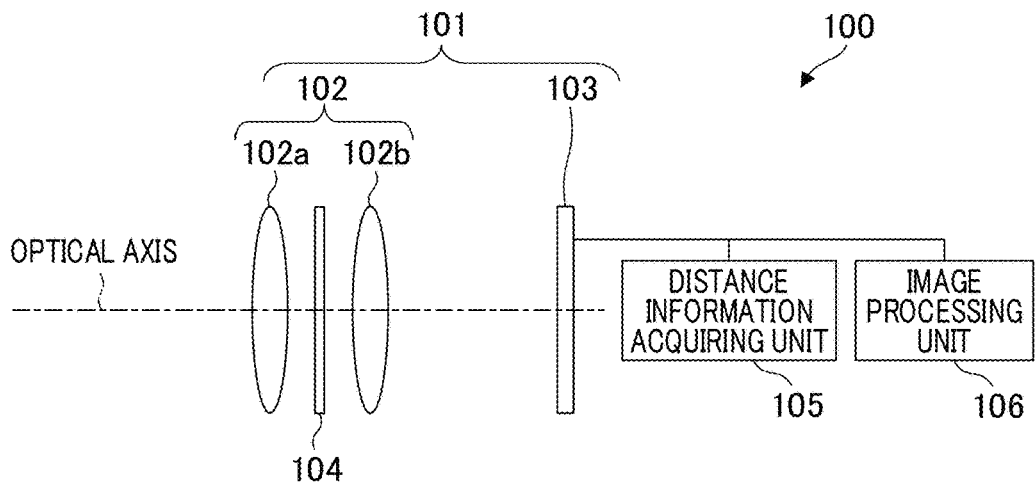
FIGS. 1A to 1C are explanatory diagrams of a distance measuring device according to the first embodiment.
Figure 1B:
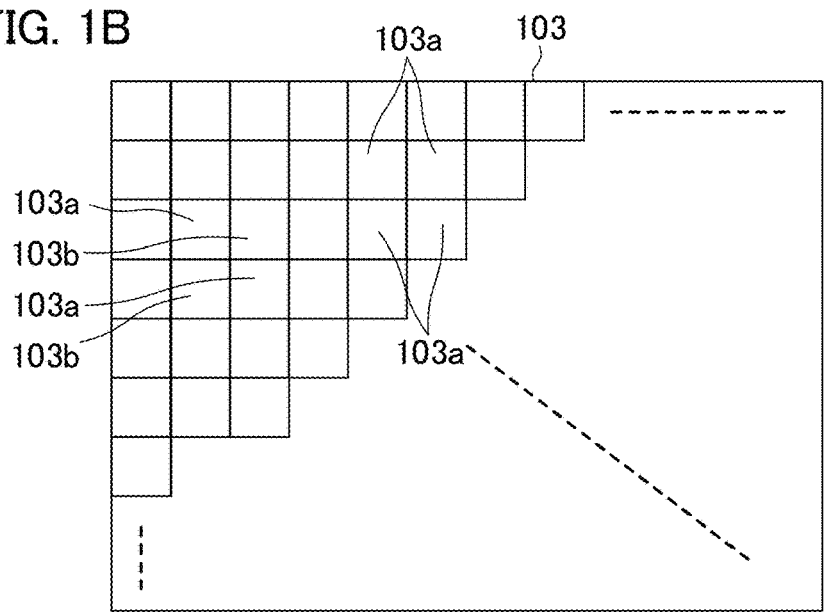

FIGS. 1A and 1B schematically illustrate a configuration of a distance measuring device according to a first embodiment of the present invention. FIG. 1A is a schematic diagram illustrating an imaging unit 101, a distance information acquiring unit 105, and an image processing unit 106, which are main components of a distance measuring device 100. The imaging unit 101 includes an imaging optical system 102 and an imaging element 103 in which many pixel portions are arranged. The imaging optical system 102 includes a plurality of lenses. For example, reflected light from an object forms an image on the imaging element 103 by lenses 102a and 102b arranged along the optical axis. The imaging optical system 102 includes an optical filter 104 at a diaphragm position between the lenses 102a and 102b.

FIG. 1B is a schematic diagram illustrating the pixel arrangement of the imaging element 103. Many pixel portions of the imaging element 103 are configured by a first pixel portion and a second pixel portion. The first pixel portion is an imaging pixel portion 103a and the second pixel portion is a distance measuring pixel portion 103b. In FIG. 1B, in order to avoid complications, each pixel arrangement on the upper left side is partially shown. The imaging pixel portion 103a and the distance measuring pixel portion 103b respectively have photoelectric conversion units. A photodiode that is a photoelectric conversion element is configured by, for example, Si (silicon) and a photoelectric conversion film formed of a thin film having light absorption characteristics. For example, according to the Bayer arrangement, among four pixels of 2 rows×2 columns, the imaging pixel portions 103a having a spectral sensitivity of green (G) are arranged at diagonal positions and the imaging pixel portions 103a having a spectral sensitivity of red (R) and blue (B) are arranged one by one at the other positions.

The specific color-spectral sensitivity of the imaging pixel portion 103a is applied by primary color-color filters. Additionally, in a part of pixel portions of 2 rows×2 columns in the imaging element 103, the two imaging pixel portions 103a having a green spectral sensitivity are left as they are, and the imaging pixels portions 103a having the spectral sensitivity of red and blue are replaced by the distance measuring pixel portions 103b. The distance measuring pixel portion 103b includes a color filter that is different from the imaging pixel portion 103a. A material that is transparent in a wavelength band in which the photoelectric conversion unit of the distance measuring pixel portion 103b can receive light is used for the color filter of the distance measuring pixel portion 103b.

Figure 1C:
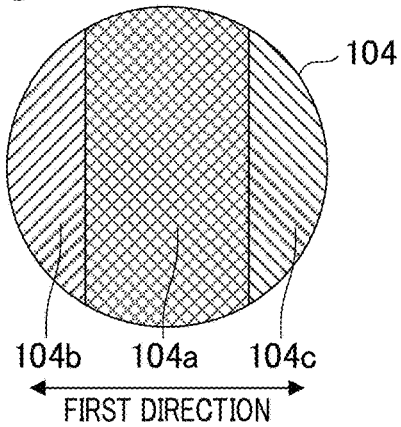

FIG. 1C is a schematic diagram in the case where the optical filter 104 is viewed from the optical axis direction. The optical filter 104 is divided into three regions and the sectioned regions are disposed along the first direction. From the left side in FIG. 1C, a second region 104b, a first region 104a, and a third region 104c are shown.

The optical filter 104 is disposed at the diaphragm position of the imaging optical system 102 and the three regions 104a to 104c in the optical filter 104 configure a pupil part region of an exit pupil of the imaging optical system 102. The first region 104a has a first spectral transmittance characteristic. The second region 104b and the third region 104c have a second spectral transmittance characteristic that is different from the first spectral transmittance characteristic. The spectral transmittance characteristic of the optical filter 104 will be described with reference to FIG. 2.

Figure 2:
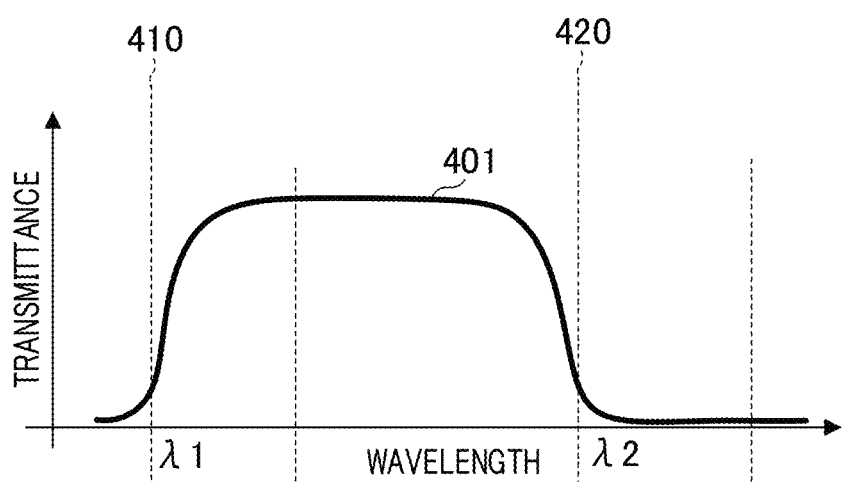
FIG. 2 is explanatory diagram of an optical filter according to the first embodiment.
Figure 2:
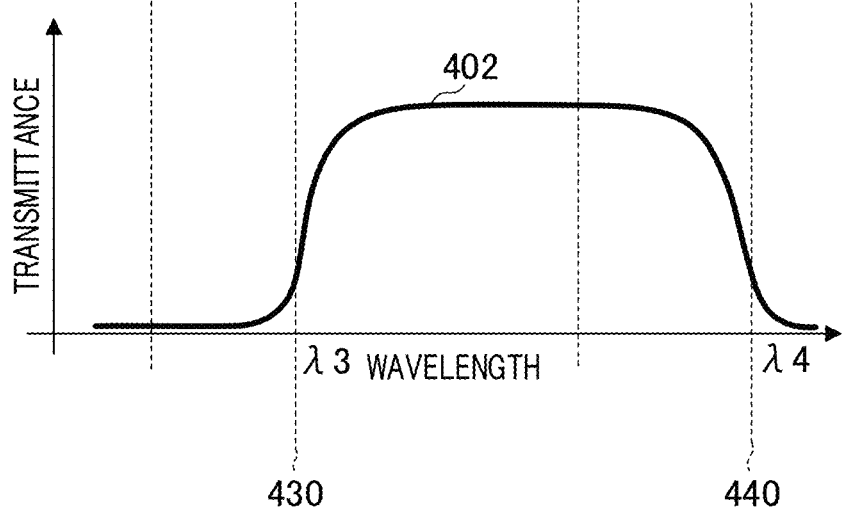

FIG. 2 is graph in which the horizontal axis represents the wavelength of light and the vertical axis represents the transmittance. A graph curve 401 shown by a solid line in A of FIG. 2 indicates a change in the first spectral transmittance due to the wavelength. A graph curve 402 shown by a solid line in B of FIG. 2 indicates a change in the second spectral transmittance due to a wavelength. The left side of the horizontal axis is the short wavelength side and the right side is the long wavelength side. The first spectral transmittance shown by the graph curve 401 is high in the range from the wavelength $\lambda 1$ shown by a dotted line 410 to the wavelength $\lambda 2$ shown by a dotted line 420. Additionally, the second spectral transmittance shown by the graph curve 402 is high in the range from the wavelength $\lambda 3$ shown by a dotted line 430 to the wavelength $\lambda 4$ shown by a dotted line 440. In FIG. 2, the relation "$\lambda 1 < \lambda 3 < \lambda 2 < \lambda 4$" is established. That is, $\lambda 1$ is a wavelength shorter than $\lambda 3$, and $\lambda 2$ is a wavelength shorter than $\lambda 4$. The second spectral transmittance is high in the range on the long wavelength side in the relative relation with the first spectral transmittance.

The imaging pixel portion 103a has one photoelectric conversion unit and acquires a pixel signal of an optical image based on a light flux that passes through the first region 104a of the optical filter 104. Additionally, the distance measuring pixel portion 103b has two photoelectric conversion units, and acquires pixel signals of a pair of optical images based on the light flux that passes through each of the second region 104b and the third region 104c of the optical filter 104. Each photoelectric conversion unit outputs an image signal in accordance with an amount of received light by photoelectric conversion.

The distance information acquiring unit 105 calculates the parallax of a pair of optical images based on the image signals generated from the pixel signals acquired by the plurality of the distance measuring pixel portions 103b. Based on the calculated parallax, the distance information acquiring unit 105 calculates a distance (object distance)

from the imaging unit to the object. Specifically, the distance measuring device measures an object distance by using the imaging plane phase difference method.

The image processing unit 106 performs predetermined image processes to pixel signals acquired by the imaging pixel portions 103a. The predetermined image processes are, for example, demosaicing and a noise reduction process, by which color image data of three channels corresponding to color components of red (R), green (G), and blue (B) can be obtained. Considering that color image data is acquired based on light that has passed through the first region 104a received by the imaging pixel portions 103a, it is desirable that the band from wavelength λ1 to wavelength λ2 shown in A of FIG. 2 serves as a visible wavelength range from blue to red. For example, the wavelength λ1 can be set to 400 nm (nanometer) and the wavelength λ2 can be set to 700 nm.

According to the present embodiment, in the imaging unit 101 shown in FIG. 1A, the lenses 102a and 102b of the imaging optical system 102 are fixed, where a configuration for realizing what is referred to as an "auto focus (AF) function" is omitted. That is, a focus is fixed in the imaging unit 101. The present invention is not limited to such an example, and the imaging unit 101 may have an AF function. In this case, the focus adjustment control unit performs AF control based on the distance information to the object or a defocus amount calculated by the distance information acquiring unit 105.

Figure 3A:
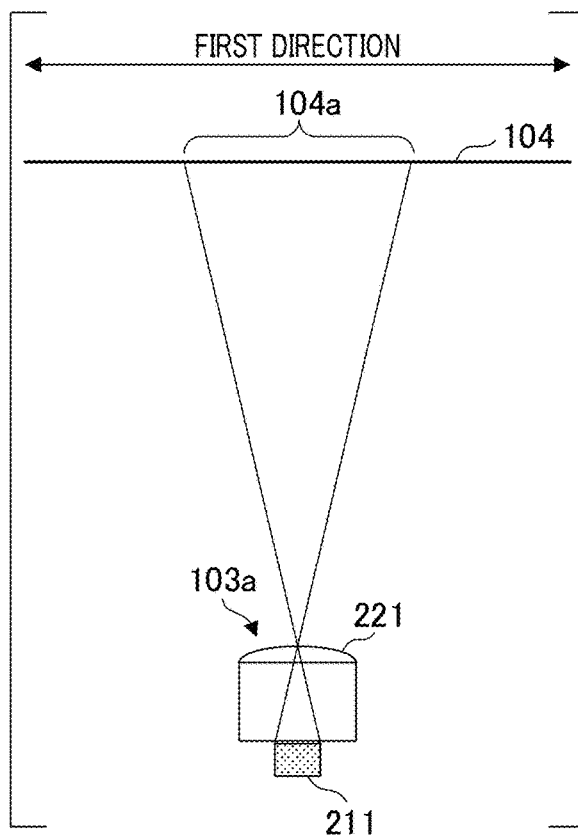
FIGS. 3A to 3E illustrate the relation between the optical filter and an imaging element according to the first embodiment.
Figure 3B:
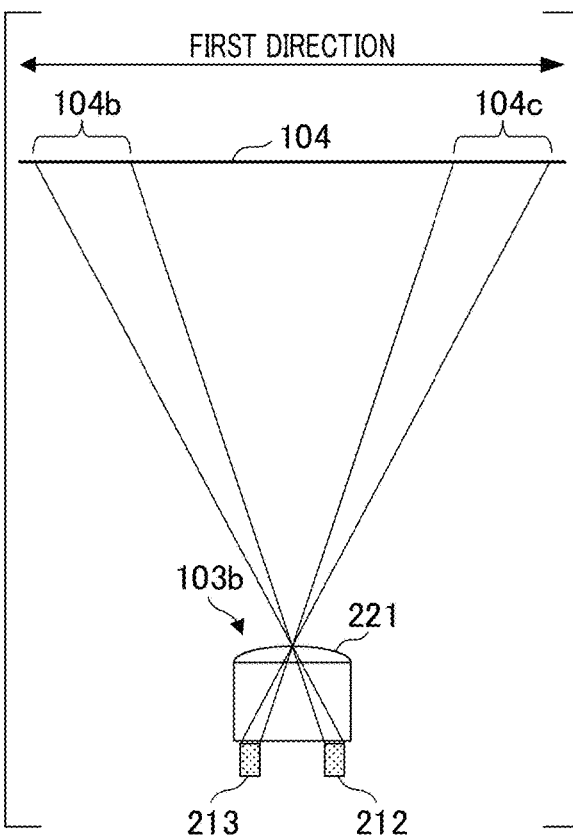
Figure 3C:
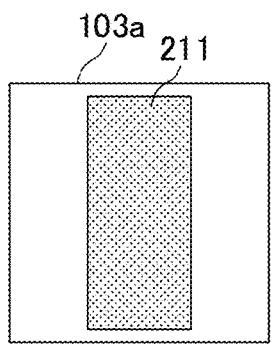
Figure 3D:
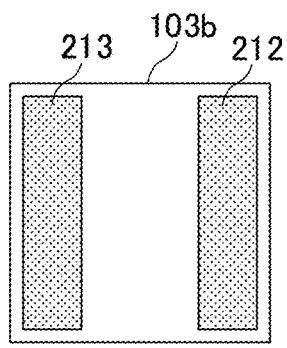

FIGS. 3A to 3E illustrate a manner in which light is received by the imaging pixel portion 103a and the distance measuring pixel portion 103b of the imaging element 103. FIG. 3A is a schematic diagram of the optical filter 104 and the imaging pixel portion 103a viewed from the side. FIG. 3B is a schematic diagram of the optical filter 104 and the distance measuring pixel portion 103b viewed from the side. FIG. 3C illustrates a photoelectric conversion unit 211 of the imaging pixel portion 103a corresponding to FIG. 3A, and FIG. 3D is a schematic diagram illustrating photoelectric conversion units 212 and 213 of the distance measuring pixel portion 103b corresponding to FIG. 3B.

In FIG. 3A, a micro lens 221 is disposed in the vicinity of the image plane of the imaging optical system 102, and focuses light that has passed through the first region 104a of the optical filter 104 to the first photoelectric conversion unit 211. The imaging optical system 102 and the micro lens 221 are configured such that the exit pupil of the imaging optical system 102 and the first photoelectric conversion unit 211 become optically conjugated. Accordingly, the shape of the first photoelectric conversion unit 211 is projected onto the exit pupil of the imaging optical system 102 by the micro lens 221. By appropriately setting the arrangement (position and size) of the first photoelectric conversion unit 211, the first photoelectric conversion unit 211 is formed so as to receive light that has passed through the first region 104a.

In FIG. 3B, the micro lens 221 is disposed in the vicinity of the image plane of the imaging optical system 102, and the light that has passed through the second region 104b and the third region 104c of the optical filter 104 is respectively condensed to the second photoelectric conversion unit 212 and the third photoelectric conversion unit 213. The imaging optical system 102 and the micro lens 221 are configured such that the exit pupil of the imaging optical system 102 optically conjugates with the second photoelectric conversion unit 212 and the third photoelectric conversion unit 213. Accordingly, the shapes of the second photoelectric conversion unit 212 and the third photoelectric conversion unit 213 are projected onto the exit pupil of the imaging optical system 102 by the micro lens 221. By appropriately setting the arrangement (position and size) of the second photoelectric conversion unit 212, the second photoelectric conversion unit 212 is formed so as to receive light that has passed through the second region 104b. Similarly, by appropriately setting the arrangement (position and size) of the third photoelectric conversion unit 213, the third photoelectric conversion unit 213 is formed so as to receive light that has passed through the third region 104c.

Since the optical filter 104 is disposed at the diaphragm position of the imaging optical system 102, the first region 104a, the second region 104b, and the third region 104c each configure the partial region of the exit pupil of the imaging optical system 102. That is, the first photoelectric conversion unit 211, the second photoelectric conversion unit 212, and the third photoelectric conversion unit 213 receive light that has passed through each of the partial regions of the exit pupil of the imaging optical system 102. The second photoelectric conversion unit 212 receives light that has passed through the second region 104b and performs photoelectric conversion, and the third photoelectric conversion unit 213 receives light that has passed through the third region 104c and performs photoelectric conversion. As a result, a pair of optical images having a parallax in accordance with the distance to the object can be obtained. A calculation process for detecting a parallax amount is executed on a pair of image signals based on a pair of optical images, and the parallax is calculated. The pair of image signals is viewpoint image signals having different viewpoints from each other. Details of the parallax calculation process will be described below with reference to FIGS. 5A and 5B.

Figure 4A:
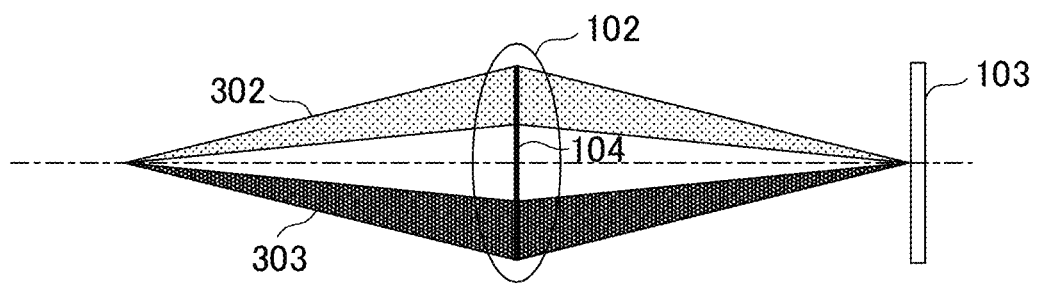
FIGS. 4A to 4C illustrate the relation between a light flux and an amount of parallax according to the first embodiment.
Figure 4B:
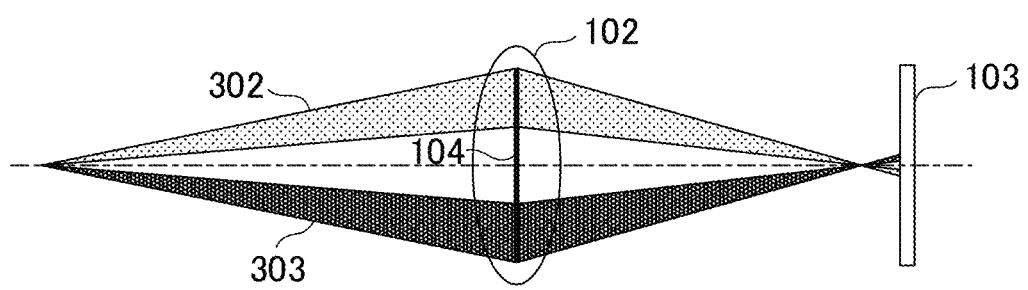
Figure 4C:
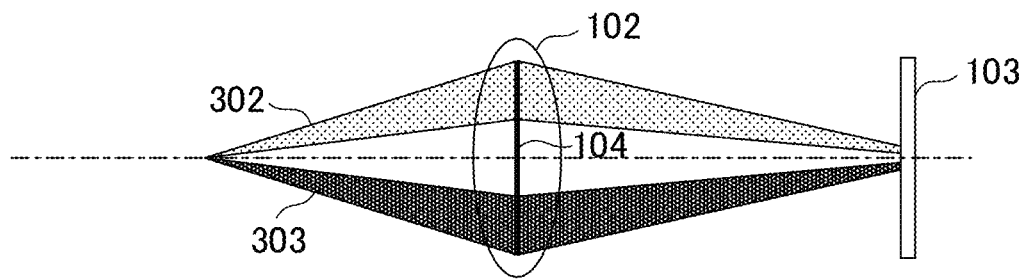

With reference to FIGS. 4A to 4C, a process that calculates a defocus amount based on the parallax will be described based on the principle of triangulation. FIGS. 4A to 4C schematically illustrate the positional relation between the imaging optical system 102, the optical filter 104, and the imaging element 103, and illustrate a light flux that is a target for photoelectric conversion performed by the second photoelectric conversion unit 212 and the third photoelectric conversion unit 213. A light flux 302 indicates a light flux passing through the second region 104b of the optical filter 104, and the second photoelectric conversion section 212 performs photoelectric conversion. A light flux 303 indicates a light flux passing through the third region 104c of the optical filter 104, and the third photoelectric conversion unit 213 performs photoelectric conversion. Note that each of the spectral transmittances of the second region 104b and the third region 104c has the second spectral transmittance characteristic shown in B of FIG. 2. That is, both of the wavelength bands of the light flux 302 and the light flux 303 are bands corresponding to the range from the wavelength λ3 to the wavelength λ4.

FIG. 4A illustrates a focused state in which a predetermined object is in focus, and the light flux 302 and the light flux 303 converge on the imaging element 103. In this case, the parallax of a pair of optical images is zero. FIG. 4B and FIG. 4C illustrate an unfocused state. FIG. 4B illustrate a defocus state in the case where light is imaged on the object side (the left side in the drawing) rather than on the imaging element 103. In this case, the light flux 302 and the light flux 303 converge on the side of the imaging optical system 102 rather than the imaging element 103, and the parallax of the pair of optical images becomes a negative value. FIG. 4C shows a defocus state in the case where light is imaged on the right side of the imaging element 103, in other words, on the side opposite to the imaging optical system 102. In this case, the light flux 302 and the light flux 303 do not converge between the imaging optical system 102 and the imaging element 103, but converge on the rear side of the imaging element 103 (the right side in the drawing). In this case, the parallax of the pair of optical images becomes a positive value. It is understood from the comparison between FIG. 4B and FIG. 4C that the positive and negative of the parallax are interchanged in accordance with the positive and negative of the defocus amount. Additionally, it is also understood that the parallax corresponding to the imaging relation of the imaging optical system 102 occurs in accordance with the defocus amount. The defocus amount can be converted into a distance from the imaging unit 101 to the object by using a conversion coefficient based on the focal distance and the principal point position of the imaging optical system 102.

Figure 5A:
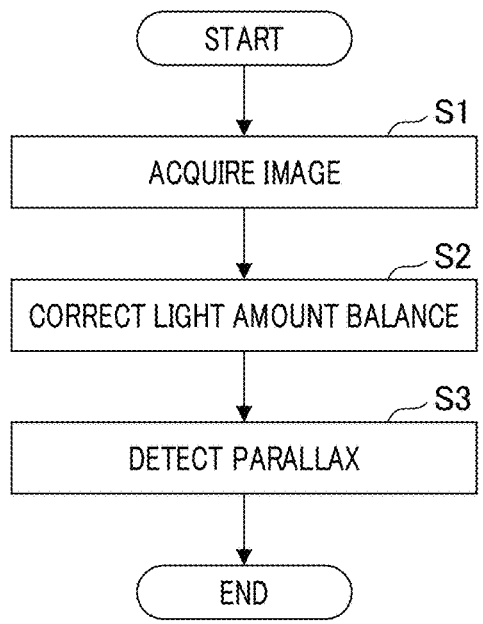
FIGS. 5A and 5B are explanatory diagrams of a parallax amount detection method according to the first embodiment.
Figure 5B:
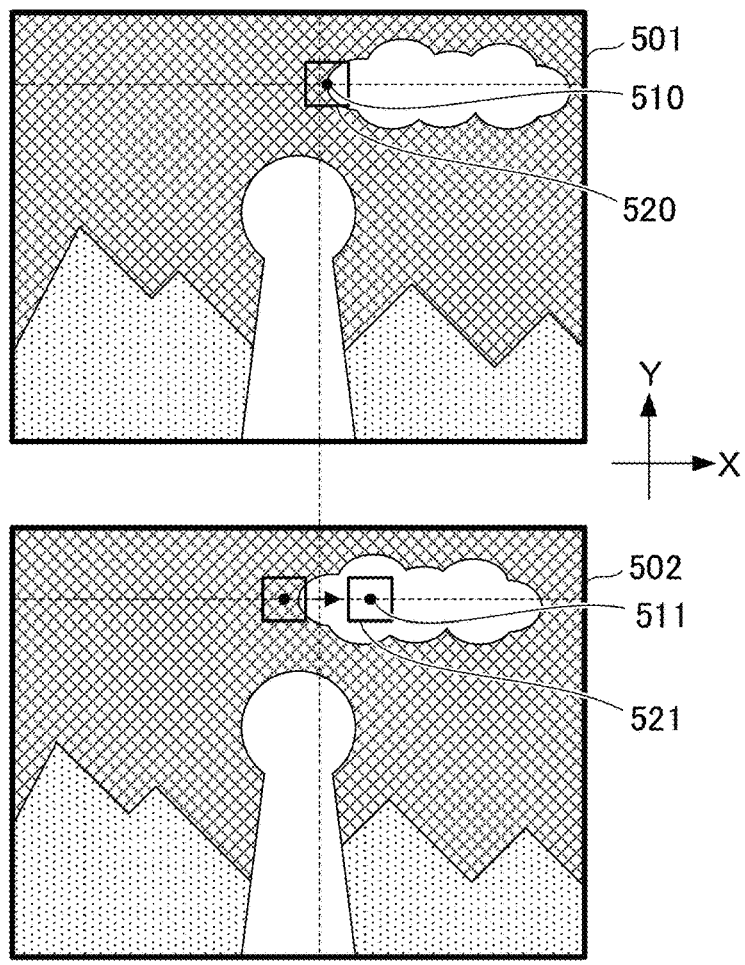

Next, with reference to FIGS. 5A and 5B, a calculation process for detecting a parallax amount will be described. FIG. 5A is a flowchart illustrating a process performed by the distance information acquiring unit 105. First, in step S1, a process that acquires a pair of image data from the output of the distance measuring pixel portion 103b of the imaging element 103 is performed. A pair of image data is viewpoint image data having different viewpoints from each other.

In step S2, a correction process of a light amount balance between a pair of images is performed. In the correction process of a light amount balance, a light amount difference between a pair of images occurring, in particular, at the peripheral image height due to the vignetting of the imaging optical system 102 and the like is corrected. This correction method is well known, and for example, it is possible to acquire and store image data obtained by shooting a uniform plane light source in advance, and calculate a light amount balance correction coefficient for correcting the light amount balance by using the image data. In step S2, the light amount balance of a pair of images is corrected by using the light amount balance correction coefficient.

In step S3, an amount of parallax between a pair of images is detected. The method for detecting an amount of parallax will be described with reference to FIG. 5B. In FIG. 5B, among a pair of images, a first image 501 is shown on the upper side and a second image 502 is shown on the lower side. The axis parallel to the first direction (see FIG. 1C, FIG. 3A and FIG. 3B) is defined as the X axis and the axis perpendicular to the X axis is defined as the Y axis. In the calculation process for detecting the parallax amount, first, the image 501 is selected as a reference image and a collation region 520 is set in the image. The collation region is a local region that is centered on a point of interest 510. If the size of the collation region is small, a calculation error in an amount of parallax due to local calculation may occur. Therefore, the collation region is set to a size of approximately 9×9 pixels.

Next, the image 502 is selected as an image of a reference destination, and a collation region 521 is set on the image 502. The collation region 521 is a local region centered on a reference point 511. The degree of correlation between the image data in the collation region 520 and the image data in the collation region 521 is calculated while moving the reference point 511 along the X axis. A reference point having the highest correlation for these collation regions is determined as a corresponding point. A relative positional deviation amount between the point of interest and the corresponding point is calculated as an amount of parallax. The amount of parallax at each pixel position in the image 501 can be calculated by performing the above process while sequentially moving the point of interest 510. Note that, as a method for calculating the degree of correlation, for example, there is a method referred to as SSD (Sum of Squared Difference) in which the sum of squares of differences between pixel values is used as an evaluation value.

In the calculation process of the parallax amount detection, a parallax amount is calculated by evaluating the similarity (correlation degree) of the image in the local region between the pair of images. Accordingly, if there is much noise contained in the image, the similarity cannot be accurately evaluated, and a calculation error in the parallax amount may occur. Although there are various factors for the generation of noise included in the image, a light shot noise generated by the photodiode is dominant. In order to reduce a calculation error in the parallax amount due to the light shot noise, increasing an amount of light received by the distance measuring pixel portion 103b is required. Although an incident light to the imaging optical system 102 is limited, an amount of light received by the distance measuring pixel portion 103b can be increased by receiving light in the wavelength band as wide as possible by the photoelectric conversion unit. Specifically, the second photoelectric conversion unit 212 and the third photoelectric conversion unit 213 included in the distance measuring pixel portion 103b receive light in a wider wavelength band, so that a calculation error in the parallax amount due to the light shot noise can be reduced.

In contrast, in the imaging optical system 102, the in-focus position changes in accordance with the wavelength due to the dispersion of the glass materials configuring the lens 102a and the lens 102b, and has chromatic aberration. In the imaging plane phase difference method, in converting the defocus amount into a distance to the object, a distance measurement error corresponding to the color of the object arises due to the chromatic aberration. Many glass materials that are transparent in the visible wavelength band have a normal dispersion in which the refractive index increases as the wavelength becomes shorter. Additionally, as the wavelength becomes shorter, the refractive index change per unit wavelength becomes larger. Hence, as the wavelength becomes shorter, the chromatic aberration of the imaging optical system 102 becomes longer. Therefore, it is possible to reduce a distance measurement error caused by the chromatic aberration of the imaging optical system 102 by removing a component on the short wavelength side, of the light components received by the second photoelectric conversion unit 212 and the third photoelectric conversion unit 213 provided in the distance measuring pixel portions 103b.

In recognizing the surrounding environment of the image imaging unit 101 by using, for example, machine learning, it is desirable that the color reproducibility of a color image obtained by performing an image process on image signals output from the imaging pixel portions 103a is high. For example, if the light received by the first photoelectric conversion unit 211 of the imaging pixel portion 103a does not include a component corresponding to a wavelength range of blue, discrimination between a blue object and a black object becomes difficult. If the light received by the first photoelectric conversion unit 211 contains a component corresponding to the near infrared wavelength range, each pixel having spectral sensitivity of red, green, and blue has a sensitivity also in the near infrared wavelength range. Hence, an object and the like having a high spectral reflectance in the near infrared wavelength range may be recognized as white even though it is black in the visible wavelength range. In viewing such a color image, the visibility deteriorates. Therefore, it is desirable that light received by the first photoelectric conversion unit 211 of the imaging pixel portion 103a does not include light in a wavelength range outside the visible wavelength range while covering the visible wavelength range.

The imaging unit 101 provided in the distance measuring device according to the present embodiment is configured such that the spectral transmittance of the first region 104a of the optical filter 104 arranged at the diaphragm position of the imaging optical system 102 becomes a visible wavelength range from blue to red. A color image obtained by performing an image process on the output image signal output from the plurality of imaging pixel portions 103a is an image acquired by using light in the visible wavelength range and is an image having high color reproducibility. Additionally, as shown in B of FIG. 2, the spectral transmittances of the second region 104b and the third region 104c of the optical filter 104 disposed at the diaphragm position of the imaging optical system 102 have the characteristic that light from the wavelength $\lambda 3$ to the wavelength $\lambda 4$ is transmitted. By setting the wavelength $\lambda 3$ longer than the wavelength $\lambda 1$, the two photoelectric conversion units provided in the distance measuring pixel portion 103b receive light in the wavelength band in which the chromatic aberration of the imaging optical system 102 is small. Additionally, by setting the wavelength $\lambda 4$ longer than the wavelength $\lambda 2$, the two photoelectric conversion units provided in the distance measuring pixel portion 103b receive light in a wider wavelength band. Specifically, it is possible to reduce a distance measurement error due to the influence of noise by increasing an amount of light received by the two photoelectric conversion units provided in the distance measuring pixel portion 103b while reducing a distance measurement error caused by the chromatic aberration of the imaging optical system 102.

As described above, the distance measuring device 100 according to the present embodiment can simultaneously acquire a color image having high color reproducibility and distance information with highly accuracy. In the present embodiment, a configuration example is shown in which the imaging pixel portion 103a has one photoelectric conversion unit on the light receiving plane and the distance measuring pixel portion 103b includes two photoelectric conversion units. As shown in FIG. 3C, the imaging pixel portion 103a includes one photoelectric conversion unit 211. As shown in FIG. 3D, the distance measuring pixel portion 103b includes two photoelectric conversion units 212 and 213.

Figure 3E:
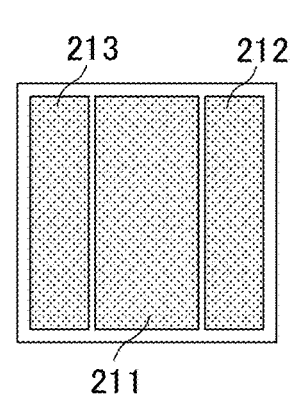

A configuration different from such a configuration may be used. For example, as shown in FIG. 3E, both the imaging pixel portion 103a and the distance measuring pixel portion 103b includes three photoelectric conversion units 211, 212, and 213. With regard to the imaging pixel portion 103a, color image data is generated without using the output signals of the photoelectric conversion unit 212 and the photoelectric conversion unit 213. Alternatively, the imaging element 103 is wired so as not to output each of the signals of the photoelectric conversion unit 212 and the photoelectric conversion unit 213. In contrast, with regard to the distance measuring pixel portion 103b, the distance information is generated based on the viewpoint image data by using the output signals of the photoelectric conversion units 212 and 213 without using the output signal of the photoelectric conversion unit 211. Alternatively, the imaging element 103 is wired so as not to output the signal of the photoelectric conversion unit 211. The imaging element 103 can be manufactured more easily by sharing the structure of the imaging pixel portion 103a and the distance measuring pixel portion 103b on the light receiving plane.

In the second spectral transmittance shown by the graph curve 402 in B of FIG. 2, the wavelength $\lambda 3$ can be determined taking into consideration the chromatic aberration of the imaging optical system 102 and the distance measurement accuracy required for the distance measuring device. In typical glass materials, taking into consideration that, in a wavelength region of 450 nm or less, the refractive index change per unit wavelength sharply increases, the wavelength $\lambda 3$ in the second spectral transmittance is preferably 450 nm or more. Desirably, distance measurement with high accuracy can be performed even if some chromatic aberration of the imaging optical system 102 remains by further setting the wavelength $\lambda 3$ to a wavelength longer than 450 nm. As an example of the simplest achromatic lens, the case of using two lenses will be described. A first glass material (refractive index 1.52, Abbe number 64) and a second glass material (refractive index 1.70, Abbe number 30), which are generally used as the glass material for a lens configuring the imaging optical system 102, are exemplified. In a focal length of 40 mm, the wavelength $\lambda 3$ is set to 470 nm in order to make the distance measurement error of the object located at a distance of 2 m less than 15%. If it is necessary to perform distance measurement with higher accuracy, the distance measurement error of the object located at the distance of 2 m to less than 10% is enabled by setting the wavelength $\lambda 3$ to 490 nm.

Si, which is generally used for the photoelectric conversion element of the imaging element 103, has a band gap of 1.1 eV. Taking this into consideration, the upper limit of the wavelength that can be absorbed is 1100 nm. Accordingly, in the second spectral transmittance, the wavelength $\lambda 4$ is preferably 1100 nm or less. Desirably, the wavelength $\lambda 4$ is set to be shorter than 1000 nm as a result in order to take into consideration that the absorption coefficient of Si is smaller toward the longer wavelength side and the crosstalk between adjacent pixels becomes larger.

Figure 6A:
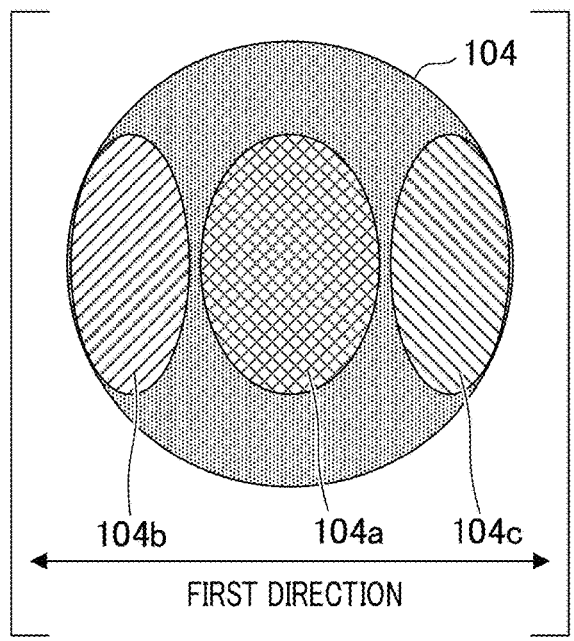
FIGS. 6A to 6C illustrate regions of the optical filter according to the first embodiment.

Taking into consideration that the optical filter 104 is disposed in the imaging optical system 102, it is desirable that the spectral transmittance is applied with absorption characteristics. For example, an optical thin film having different optical characteristics can be formed on a glass substrate by film formation for each segmented region. Additionally, the three regions in the optical filter 104 may be configured such that light that has passed through each region is incident to the corresponding photoelectric conversion units. FIG. 6A illustrates a configuration example of the optical filter 104.

Figure 6B:
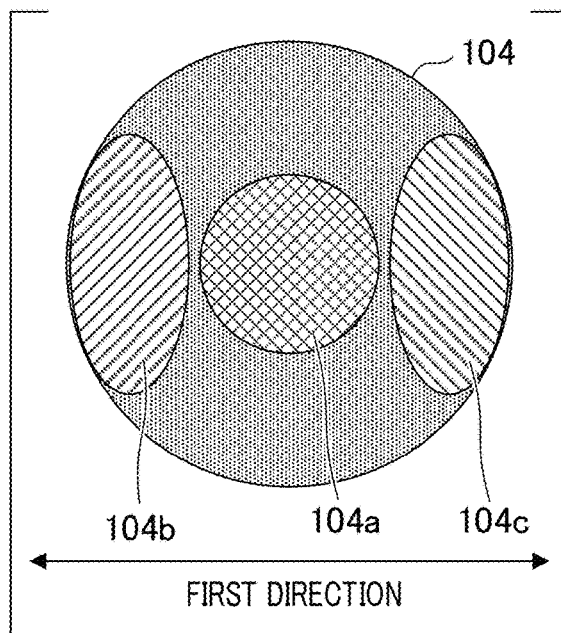

In FIG. 6A, a region other than the first region 104a, the second region 104b, and the third region 104c in the optical filter 104 is a region configured to shield the light from the wavelength $\lambda 1$ to the wavelength $\lambda 4$. The image region in a defocused state in the color image acquired by the imaging unit 101 has a blur shape that reflects the shape of the first region 104a of the optical filter 104. As shown in FIG. 6B, the quality as a viewing image can be improved by bringing the blur shape close to a round shape.

Figure 6C:
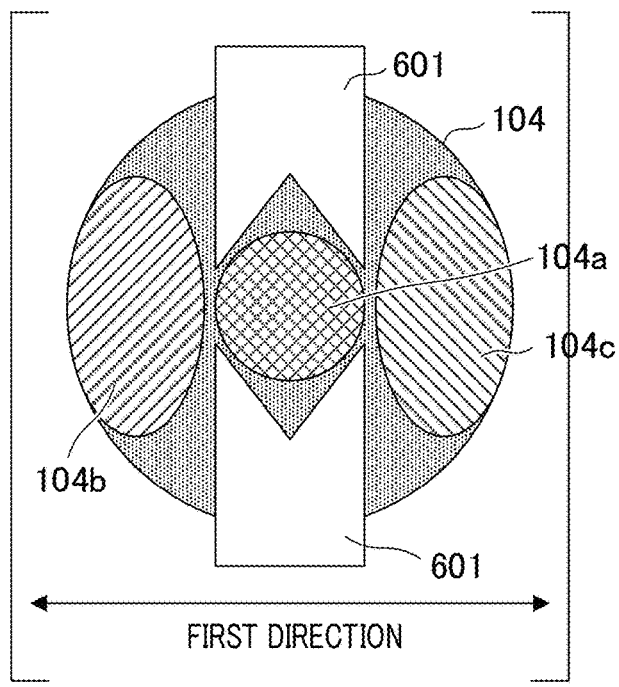

Additionally, in the configuration including a diaphragm 601 as shown in FIG. 6C, a diaphragm value of the first region 104a may be changed by moving the diaphragm 601 vertically. The area ratio of the three regions in the optical filter 104 is set based on the S/N ratio (signal-to-noise ratio) required for the output signal of the plurality of imaging pixel portions 103a and the S/N ratio required for the output signal of the plurality of distance measuring pixel portion 103b, and the distance measurement range. With regard to the first region 104a, the amount of light received by the imaging pixel portion 103a increases by increasing the area ratio, so that the S/N ratio of the output signal improves. In contrast, with regard to the second region 104b and the third region 104c, although the amount of light received by the distance measuring pixel portion 103b increases and the S/N ratio of the output signal increases by increasing the area ratio, the size of the blur of the image during defocusing increases. Therefore, the contrast in the image region in the defocused state decreases and the distance measuring accuracy decreases. Therefore, it is necessary to set the area ratio of the three regions in the optical filter 104 based on the distance measuring range and the minimum object illuminance required by the distance measuring device.

Figure 7:
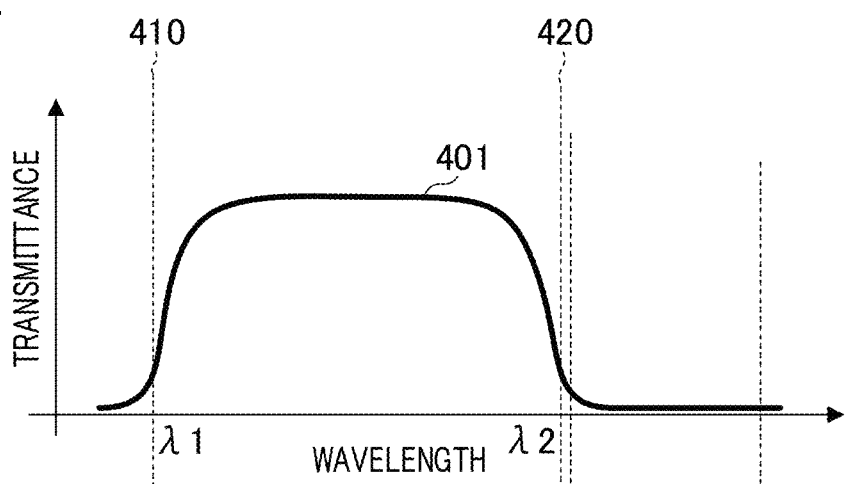
FIG. 7 is explanatory diagram of the optical filter according to a modification of the first embodiment.
Figure 7:
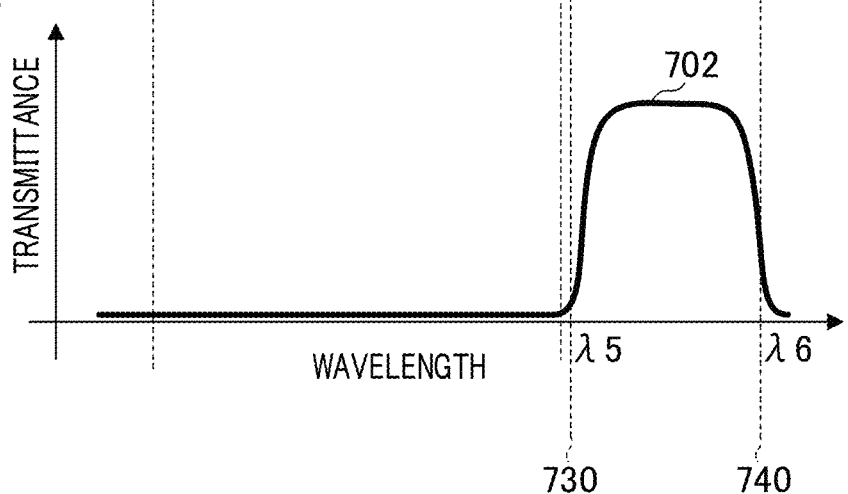

Although the spectral transmittance characteristics of the second region 104b and the third region 104c in the optical filter 104 have been described with reference to B of FIG. 2, another example is shown in FIG. 7. A of FIG. 7 is the same as A of FIG. 2. A graph line 702 shown by a solid line in B of FIG. 7 indicates the second spectral transmittance, in which the transmittance is high in the band from the wavelength $\lambda 5$ shown by a dotted line 730 to the wavelength $\lambda 6$ shown by a dotted line 740. The wavelength $\lambda 5$ is longer than the wavelength $\lambda 2$. Specifically, the light received by the distance measuring pixel portion 103b in the regions 104b and 104c is light in the wavelength band on the longer wavelength side the light received by the imaging pixel portion 103a. By serving the second spectral transmittance as the spectral transmittance characteristics shown in B of FIG. 7, the distance measurement error due to the chromatic aberration of the imaging optical system 102 can be further reduced.

In order to achieve both image quality and distance measuring accuracy, in the distance measuring device according to the present embodiment, there is a difference between the first wavelength band of light received by the photoelectric conversion unit of the imaging pixel portion and the second wavelength band of light received by the two photoelectric conversion unit of the distance measuring device. The first wavelength band is a wavelength band of the first light flux (hereinafter, referred to as the "imaging light flux") photoelectrically converted by the photoelectric conversion unit provided in the imaging pixel portion. The second wavelength band is a wavelength band of a pair of light fluxes (hereinafter, referred to as a "distance measuring light flux") photoelectrically converted by the two photoelectric conversion units provided in the distance measuring pixel portion. In the optical filter 104, the spectral transmittance characteristics are different between the first region through which the imaging light flux passes and the second region and the third region through which the distance measuring light flux passes, so that each wavelength band of the imaging light flux and the distance measurement light flux is different.

Modification 1 of the First Embodiment

Modification 1 according to the first embodiment will be described with reference to FIGS. 8A to 8D. In the present modification, the configuration of the imaging pixel portion 103a and the distance measuring pixel portion 103b of the imaging element 103 are different from the above-described configuration. In the optical filter 104 according to the present modification, the second region 104b and the third region 104c have the spectral transmittance characteristics shown in B of FIG. 7. In the following description, the same reference numerals or symbols as those in the first embodiment are used, the detailed description thereof will be omitted, and mainly the differences will be explained. Such omission of explanation is also the same in modifications, embodiments, and the like which will be described below.

Figure 8A:
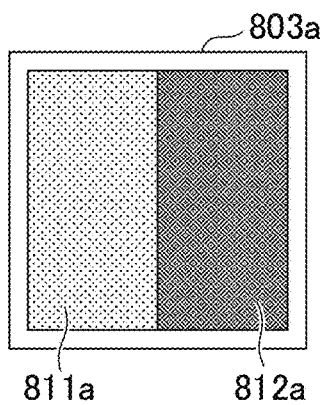
FIGS. 8A to 8D are explanatory diagrams that illustrate a configuration of a pixel portion according to the modification of the first embodiment.
Figure 8B:
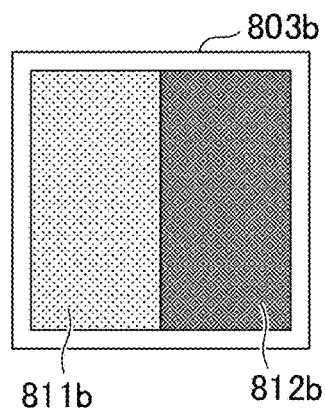

FIG. 8A illustrates the light receiving plane of an imaging pixel portion 803a included in the imaging element 103 according to the present modification as viewed from the object side. The imaging pixel portion 803a includes two photoelectric conversion units 811a and 812a. FIG. 8B illustrates the light receiving plane of a distance measuring pixel portion 803b included in the imaging element 103 according to the present modification as viewed from the object side. The distance measuring pixel portion 803b includes two photoelectric conversion units 811b and 812b. As described above, the light receiving planes of the imaging pixel portion 803a and the distance measuring pixel portion 803b are similar in configuration.

Figure 8C:
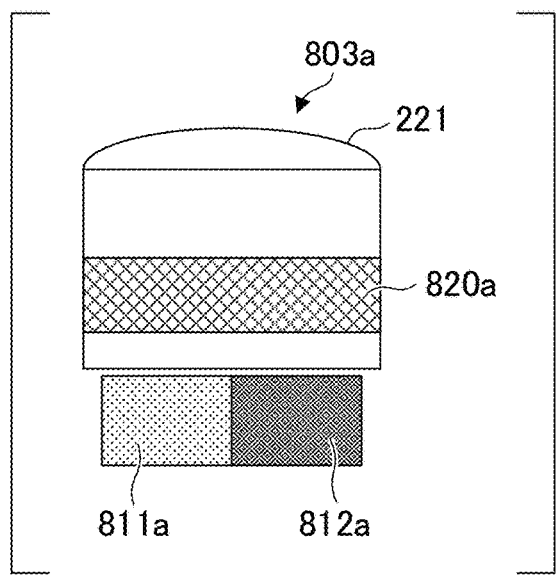
Figure 8D:
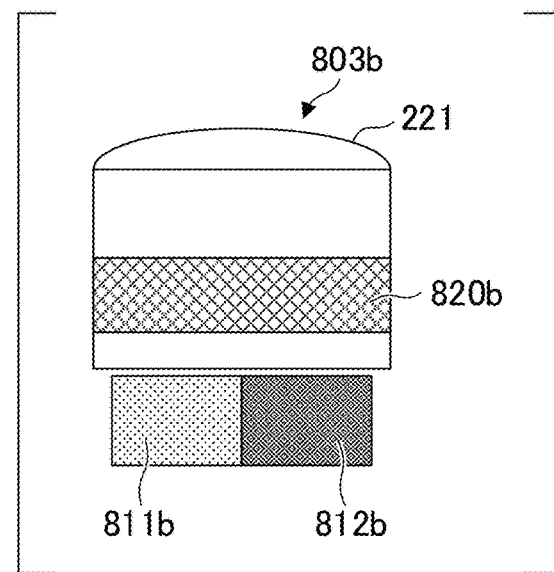

FIG. 8C is a schematic view of the imaging pixel portion 803a as viewed from the side. The imaging pixel portion 803a includes a color filter 820a having a spectral transmittance of a primary color system. In accordance with the spectral transmittance of the color filter 820a, the spectral sensitivities of blue (B), green (G), and red (R) are applied to the imaging pixel portion 803a. FIG. 8D is a schematic view of the distance measuring pixel portion 803b as viewed from the side. The distance measuring pixel portion 803b includes a color filter 820b.

Figure 9:
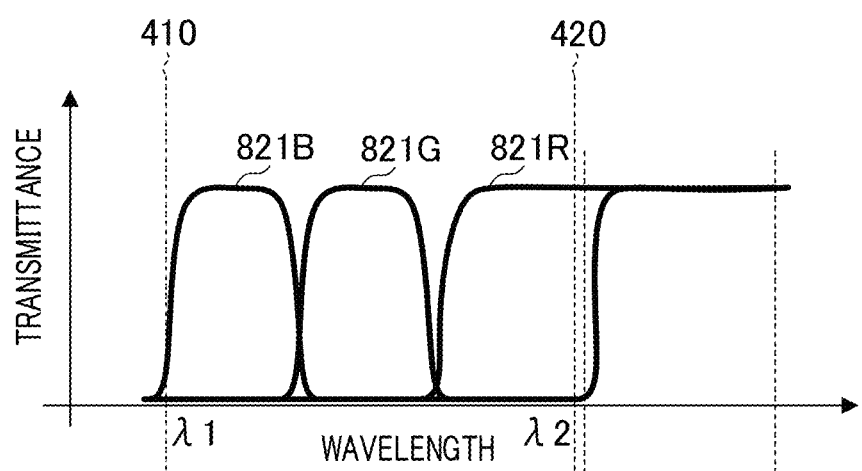
FIG. 9 are explanatory view of a color filter according to the modification of the first embodiment.
Figure 9:
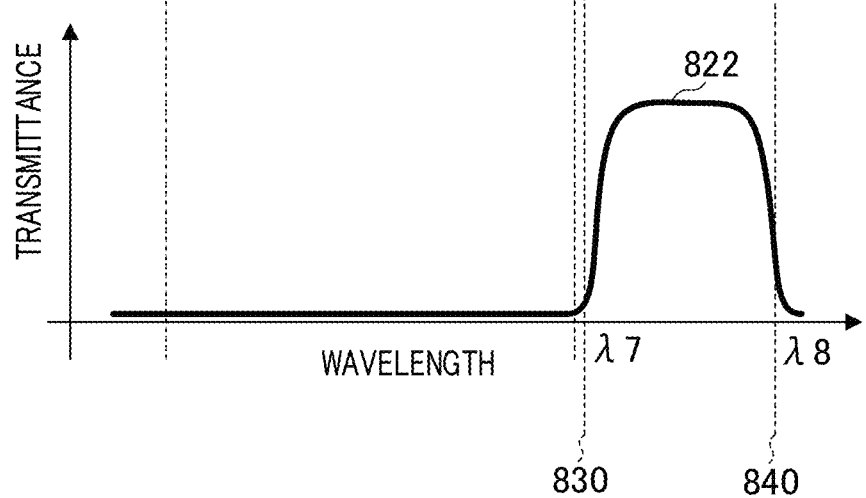

A of FIG. 9 illustrates a spectral transmittance characteristic of the color filter 820a corresponding to each color of the imaging pixel portion 803a. The horizontal axis represents a wavelength and the vertical axis represents a transmittance of the color filter. The spectral transmittances corresponding to blue (B), green (G), and red (R) are respectively shown by solid graph lines 821B, 821G, and 821R. In the visible wavelength band, the graph line 821B has a high transmittance in the wavelength band corresponding to blue, the graph line 821G has a high transmittance in the wavelength band corresponding to green, the graph line 821R has a high transmittance in the wavelength band corresponding to red.

In B of FIG. 9, the transmittance of the color filter 820b of the distance measuring pixel portion 803b is shown by a graph line 822 with a solid line. The setting of the horizontal axis and the vertical axis is the same as that in A of FIG. 9. In the color filter 820b, the transmittance from the wavelength $\lambda 7$ shown by a dotted line 830 to the wavelength $\lambda 8$ shown by a dotted line 840 is high. The wavelength $\lambda 7$ is substantially equal to the wavelength $\lambda 5$ in B of FIG. 7, and the wavelength $\lambda 8$ is substantially equal to the wavelength $\lambda 6$ in B of FIG. 7. That is, the second region 104b and the third region 104c in the optical filter 104 are substantially coincide with the color filter 820b in the wavelength bands having a high spectral transmittance.

Figure 10A:
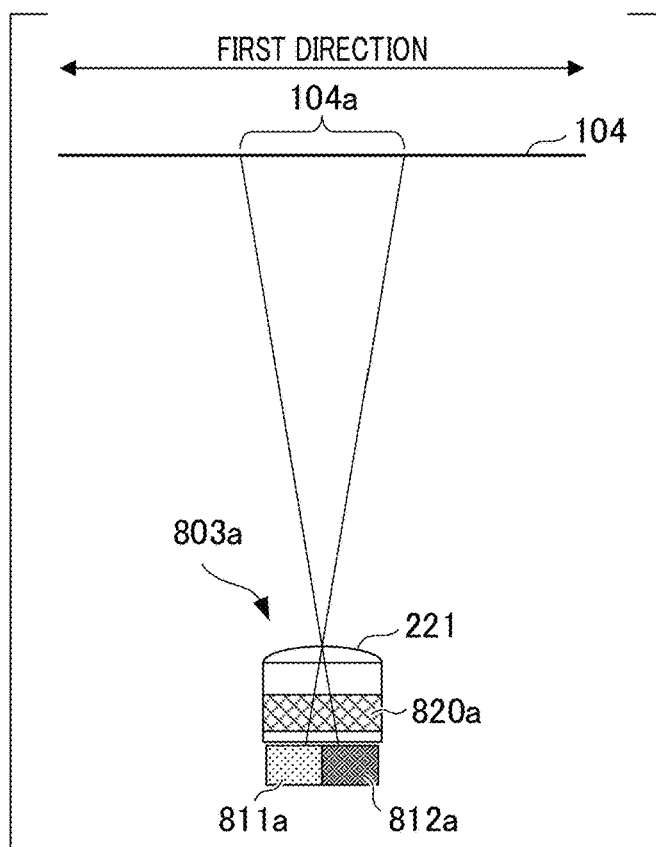
FIGS. 10A and 10B are explanatory views of the optical filter and the imaging element according to the modification of the first embodiment.
Figure 10B:
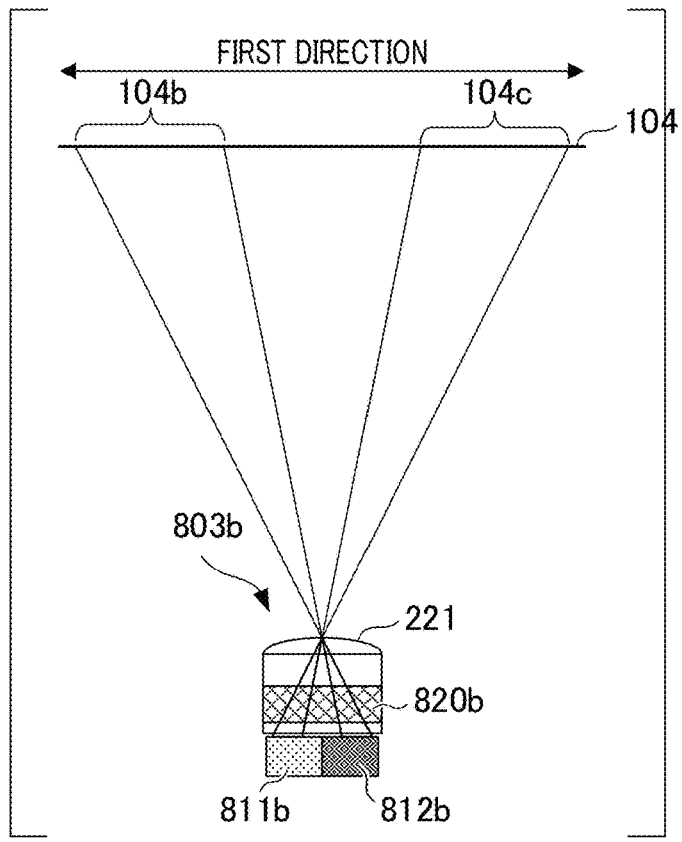

The imaging pixel portion 803a and the distance measuring pixel portion 803b receive light transmitted through a region in which the spectral transmittance of the color filter of the imaging pixel portion 803a and the distance measuring pixel portion 803b substantially coincide with the spectral transmittance of each region of the optical filter 104. With reference to FIGS. 10A and 10B, the relation between each region of the optical filter 104, the imaging pixel portion 803a, and the distance measuring pixel portion 803b will be described.

FIG. 10A is a schematic diagram illustrating the optical relation between the first region 104a of the optical filter 104 and the imaging pixel portion 803a. The signal obtained by combining the output signals from the photoelectric conversion unit 811a and the photoelectric conversion unit 812a of the imaging pixel portion 803a is equivalent to the signal obtained by receiving light that has passed through the first region 104a.

FIG. 10B is a schematic diagram illustrating the optical relation between the second region 104b and the third region 104c of the optical filter 104 and the distance measuring pixel portion 803b. The photoelectric conversion unit 812b of the distance measuring pixel portion 803b receives light that has passed through the second region 104b. The photoelectric conversion unit 811b of the distance measuring pixel portion 803b receives light that has passed through the third region 104c. That is, the distance measuring pixel portion 803b receives a pair of lights that have respectively passed through the second region 104b and the third region 104c. The optical image at this time is a pair of optical images having a parallax corresponding to a distance to the object.

According to the present modification, since the imaging pixel portion 803a receives light in the visible wavelength region in accordance with the spectral sensitivity thereof, the image acquired from the imaging pixel portions 803a maintains high color reproducibility. Further, the distance measuring pixel portion 803b receives light forming a pair of optical images based on the light in the wavelength band from λ5 to λ6 in B of FIG. 7, so that the influence of the distance measurement error due to the chromatic aberration of the imaging optical system 102 can be reduced.

Modification 2 of the First Embodiment

Figure 11A:
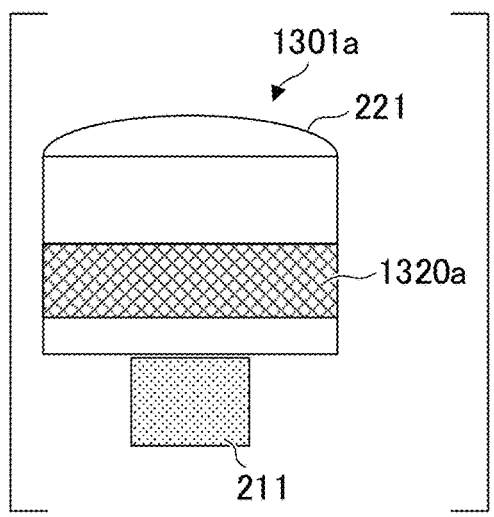
FIGS. 11A and 11B illustrate another example of the configuration of the pixel portion according to the modification of the first embodiment.
Figure 11B:
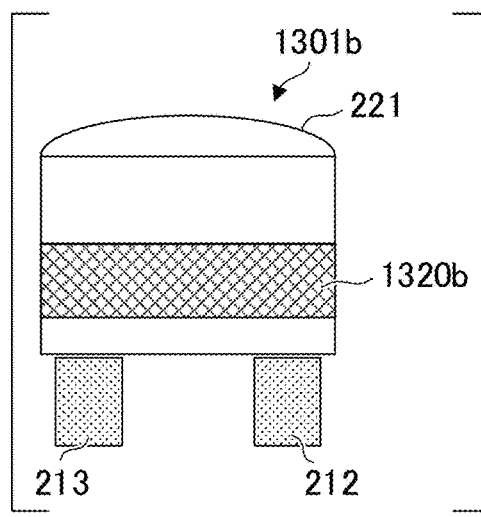

With reference to FIGS. 11A and 11B, a description will be given of a method for setting different wavelength bands between the imaging light flux and the distance measuring light flux in the modification 2 of the first embodiment. The imaging optical system according to the present modification has a configuration in which the optical filter 104 is removed from the imaging optical system 102.

FIG. 11A is a schematic diagram that illustrates the imaging pixel portion according to the modification and is a diagram in which an imaging pixel portion 1301a is viewed from the side. The imaging pixel portion 1301a includes the micro lens 221 and the photoelectric conversion portion 211. The imaging pixel portion 1301a includes an imaging color filter 1320a, and spectral sensitivities of blue, green, and red are applied in accordance with the spectral transmittance.

FIG. 11B is a schematic diagram that illustrates a distance measuring pixel portion according to the present modification and is a view in which a distance measuring pixel portion 1301b is viewed from the side. The distance measuring pixel portion 1301b includes the micro lens 221 and two photoelectric conversion units 212 and 213. The distance measuring pixel portion 1301b includes a distance measuring color filter 1320b.

The imaging color filter 1320a and the distance measuring color filter 1320b can be formed, for example, by using a dielectric multilayer film. By making the thickness of the dielectric multilayer film different for each pixel portion, the spectral transmittance characteristics shown in A of FIG. 12 can be provided. Alternatively, the dielectric multilayer film may be formed on an absorbing material. A desired spectral transmittance can be applied by supplementing a wavelength band in which light cannot be sufficiently absorbed by only the absorbing material with the dielectric layer film.

Figure 12:
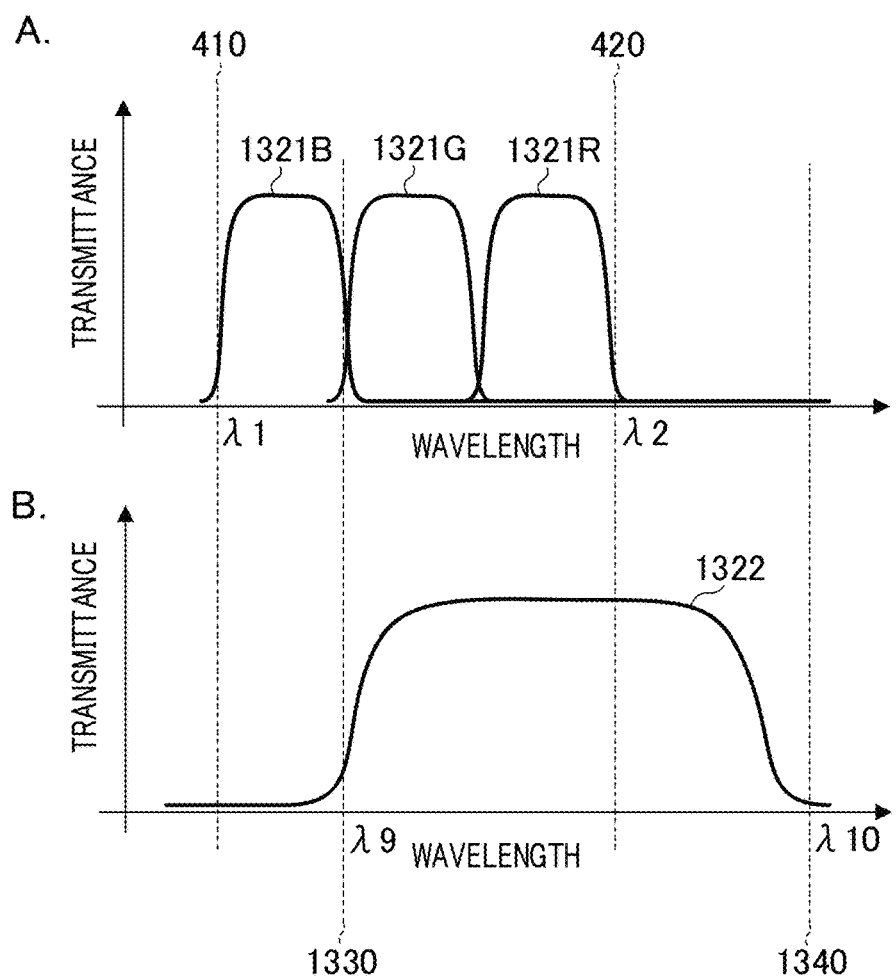
FIG. 12 illustrates another example of the color filter according to the modification of the first embodiment.

A of FIG. 12 illustrates the spectral transmittance characteristics of the imaging color filter 1320a corresponding to each color of the imaging pixel portion 1301a. The horizontal axis represents the wavelength and the vertical axis represents the transmittance. The spectral transmittances corresponding to the light of blue (B), green (G), and red (R) are shown by graph lines 1321B, 1321G, and 1321R, which are solid lines. The graph line 1321B has a high transmittance in the wavelength band corresponding to the blue color, the graph line 1321G has a high transmittance in the wavelength band corresponding to the green color, and the graph line 1321R has a high transmittance in the wavelength band corresponding to the red color. By combining the spectral transmittances corresponding to each color, a configuration to be substantially equal to the first spectral transmittance characteristic shown by the graph curve 401 in A of FIG. 2 is obtained.

B of FIG. 12 shows the transmittance of the distance measuring color filter 1320b provided in the distance measuring pixel portion 1301b by a graph curve 1322. The setting of the horizontal axis and the vertical axis is the same as that in A of FIG. 12. The transmittance of the distance measuring color filter 1320b is high in the range from the wavelength λ9 shown by a dotted line 1330 to the wavelength λ10 shown by a dotted line 1340. λ9 is substantially equal to λ3 in B of FIG. 2, and the wavelength λ10 is substantially equal to λ4 in B of FIG. 2. That is, the distance measuring color filter 1320b has the second spectral transmittance characteristic.

At the exit pupil of the imaging optical system 102, the photoelectric conversion unit 211 of the imaging pixel portion 1301a receives light that has passed through the pupil region corresponding to the image of the photoelectric conversion unit 211 projected via the micro lens 221 and the imaging optical system 102, and performs photoelectric conversion of the imaging light flux.

The photoelectric conversion units 212 and 213 of the distance measuring pixel portion 1301b receives a pair of lights that have passed through the pupil partial region that corresponds to the images of the photoelectric conversion units 212 and 213 respectively projected via the micro lens 221 and the imaging optical system 102 at the exit pupil of the imaging optical system 102. The photoelectric conversion of the distance measuring light flux is performed by the photoelectric conversion units 212 and 213. The imaging color filter 1320a has the first spectral transmittance characteristics, and the wavelength band of the imaging light flux ranges from λ1 to λ2 shown in A of FIG. 12. The distance measuring color filter 1320b has the second spectral transmittance characteristic, and the wavelength range of the distance measuring light flux ranges from λ9 to λ10 shown in B of FIG. 12.

Since the photoelectric conversion unit 211 of the imaging pixel portion 1301a receives light in the visible wavelength range, high color reproducibility of the acquired image can be maintained. Since the photoelectric conversion units 212 and 213 of the distance measuring pixel portion 1301b receive light in a band having a long wavelength with respect to the visible wavelength range, distance measurement errors due to noise and chromatic aberration of the imaging optical system 102 can be reduced.

Modification 3 of the First Embodiment

In the present modification, in a manner similar to the examples shown in FIGS. 11A and 11B, the imaging pixel portion 1301a configuring the imaging element includes the first photoelectric conversion unit 211. Additionally, the distance measuring pixel portion 1301b configuring the imaging element includes the second photoelectric conversion unit 212 and the third photoelectric conversion unit 213.

The photoelectric conversion unit 211 receives light that has passed through the first region at the exit pupil of the imaging optical system 102 and performs photoelectric conversion. The photoelectric conversion units 212 and 213 receive light that has passed through the second and third regions at the exit pupil of the imaging optical system 102 and perform photoelectric conversion.

The imaging pixel portion 1301*a* has a relatively high spectral sensitivity in a band from the first wavelength $\lambda 1$ to the second wavelength $\lambda 2$. That is, the spectral sensitivity of the imaging pixel portion 1301*a* is set such that the imaging luminous flux has a high spectral luminance from $\lambda 1$ to $\lambda 2$. Additionally, the distance measuring pixel portion 1301*b* has a relatively high spectral sensitivity in the band from the third wavelength $\lambda 3$ that is longer than the wavelength $\lambda 1$ to the fourth wavelength $\lambda 4$ that is longer than the wavelength $\lambda 2$. That is, the distance measuring pixel portion 1301*b* is set such that the distance measuring light flux has a high spectral luminance from $\lambda 3$ to $\lambda 4$. Note that a well-known technique is used for setting or correcting the spectral sensitivity.

The distance information acquiring unit 105 acquires viewpoint image data based on the signals output from each of the second photoelectric conversion unit 212 and the third photoelectric conversion unit 213. The viewpoint image data exhibit mutual parallax, and can acquire distance information, a defocus amount, or an image shift amount corresponding to the parallax. For example, in application to the imaging apparatus, the control unit controls focus adjustment of the imaging optical system by using the distance information or the defocus amount. Specifically, the AF control of the imaging plane phase difference method is performed based on a relative positional deviation amount between a plurality of images based on the distance measuring light flux. Alternatively, the image processing unit in the imaging apparatus generates data such as a distance map, an image shift amount map, a defocus map, and the like by using the plural number of the viewpoint image data that has been acquired. This data is depth information in the depth direction in the captured image and can be used for, for example, a recognition process of the object region, a viewpoint change process, and a blur correction process. Additionally, the image processing unit in the imaging apparatus generates image data for three-dimensional display (stereoscopic display) by using the acquired plurality of viewpoint image data, and outputs the image data to the display unit or recording unit.

(Application Example of Distance Measuring Device)

Figure 13A:
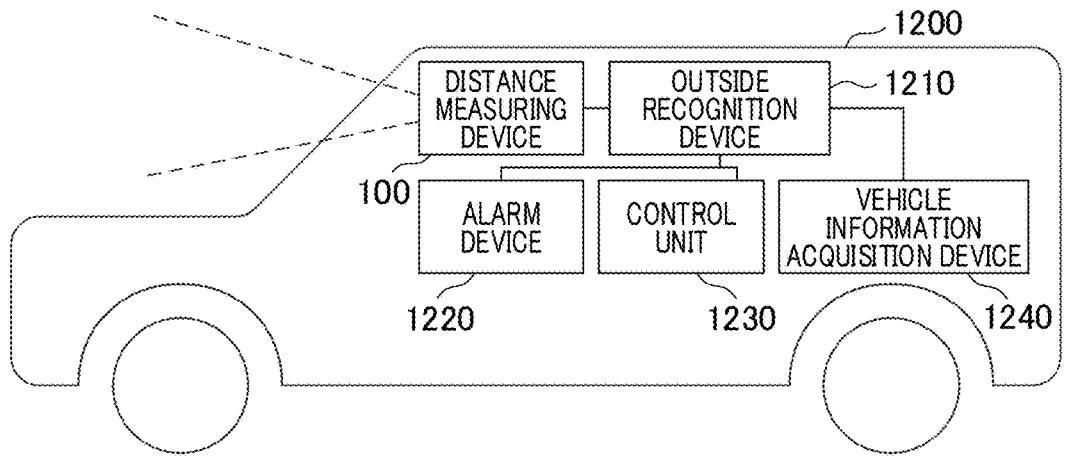
FIGS. 13A and 13B illustrate an example applied to a vehicle equipped with the distance measuring device according to the first embodiment.
Figure 13B:
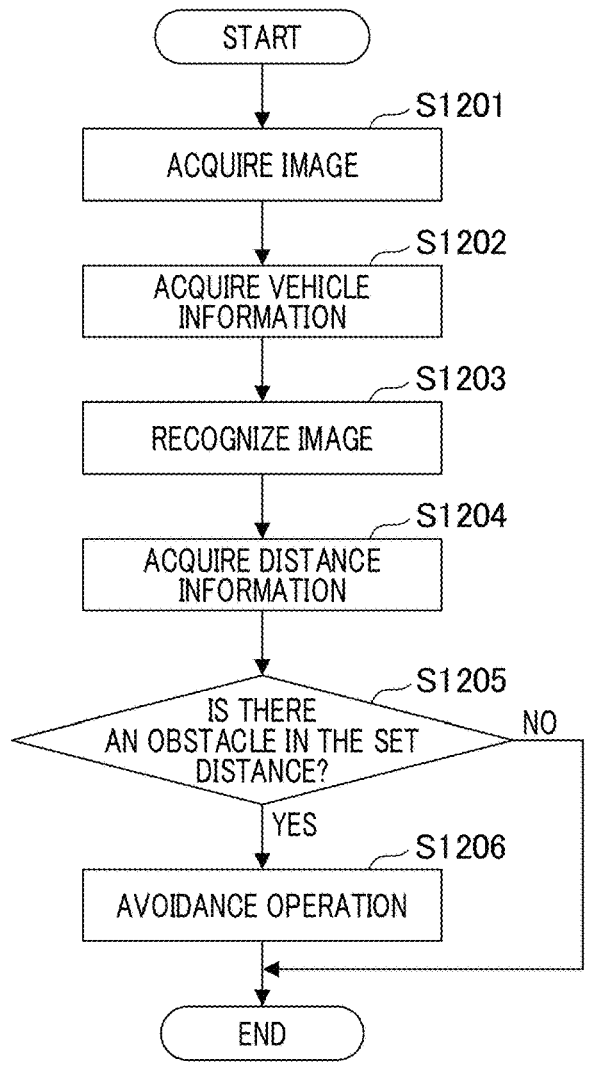

The distance measuring device according to the present embodiment can be used, for example, as an information acquiring unit for recognizing the outside of the moving device. With reference to FIGS. 13A and 13B, an example in which a distance measuring device is mounted on a moving device will be described. A moving device that moves due to the driving unit can be applied to a car, a ship, an aircraft, a drone, an industrial robot, and the like. An example applied to a car will be explained below.

FIG. 13A is a schematic view that illustrates a main part of a configuration of a car. A vehicle 1200 is equipped with the distance measuring device 100, an outside recognition device 1210, an alarm device 1220, a control unit 1230, and a vehicle information acquisition device 1240. The outside recognition device 1210 recognizes the outside based on the distance information and the image acquired by the distance measuring device 100. For example, the distance measuring device 100 is installed at a predetermined position in the vehicle close to the front (or rear) windshield of the vehicle 1200 and performs imaging of the front field of view (or the rear field of view) of the vehicle 1200. The outside recognition device 1210 can recognize the presence of a preceding vehicle based on images acquired by the imaging pixel portions 103*a* of the imaging element 103 of the distance measuring device 100. Furthermore, it is possible to recognize the position of a preceding vehicle of the vehicle 1200 based on the distance information to the preceding vehicle.

The outside recognition device 1210 is connected to the alarm device 1220, the control unit 1230, and the vehicle information acquisition device 1240. The outside recognition device 1210 acquires one or more pieces of vehicle information such as a vehicle speed, a yaw rate, and a steering angle from the vehicle information acquisition device 1240 to serve as information for the moving device.

The control unit 1230 controls the driving unit of the vehicle 1200 based on the recognition result of the outside recognition device 1210. The alarm device 1220 issues an alarm based on the recognition result of the outside recognition device 1210. For example, assume the case in which there is a high possibility of colliding with the vehicle in front as a result for the recognition of the outside recognition device 1210. The control unit 1230 performs control such as breaking the vehicle 1200, returning the accelerator, and suppressing the engine output so as to avoid collision with the vehicle on front or perform vehicle control for reducing damage. Additionally, the alarm device 1220 performs a process that generates, for example, an alarm sound, or a process that displays warning information on a display screen of a car navigation device, a head up display, and the like. Alternatively, the alarm device 1220 issues a warning to the driver of the vehicle 1200, for example, by applying a vibration to a seat belt and a steering wheel.

FIG. 13B is a flowchart illustrating a collision avoidance process as an operation example of the driving support system of the vehicle 1200. In step S1201, the outside recognition device 1210 acquires an image from the distance measuring device 100. Next, in step S1202, the outside recognition device 1210 acquires vehicle information from the vehicle information acquisition device 1240. In step S1203, the outside recognition device 1210 performs an image recognition process that includes feature analysis on the acquired image. Specifically, a target object is recognized by performing an analysis process of a feature amount of, for example, an edge amount and direction, a density value, color, a luminance value and the like in the image. Targets to be detected include, for example, automobiles, pedestrians, bicycles, lanes, guardrails, brake lights of vehicles, and signs. By applying the distance measuring device according to the present embodiment, it is possible to acquire a color image having high color reproducibility. Therefore, highly important objects such as the brake lamps of vehicles and signs can be recognized with high accuracy.

In the subsequent step S1204, the distance measuring device 100 generates the distance information. The distance information of the target object that is present within the captured image (within the imaging angle of view) is acquired. The distance information of the target object is the depth information pertaining to the target object (object) in the image corresponding to the distance from the distance measuring device 100 to the target to be detected. In step S1205, the outside recognition device 1210 acquires the distance information of the target object and compares it with the information of a predetermined distance range. Based on the distance information of the target object, a determination process is performed about whether or not an obstacle is present within a predetermined distance range.

Specifically, a process that determines a collision may occur in front of or behind the vehicle 1200 is performed. If an obstacle is present within a set distance, it is determined that a collision may occur and the process proceeds to step S1206. If no obstacle is present within the set distance, it is determined that collision will not occur and the process ends.

In step S1206, the control unit 1230 controls at least one of a moving direction and a moving speed of the vehicle 1200 to perform an avoidance operation. For example, the control unit 1230 generates a control signal that generates a braking force on each drive wheel of the vehicle 1200, and outputs the control signal to the vehicle control unit. The control that suppresses the output of the engine and the like is performed so that a collision between the vehicle 1200 and the preceding vehicle is avoided or the possibility of collision is reduced. The alarm device 1220 alerts a driver, for example, by sound, image, and vibration. Subsequently, the present process ends.

By the process in FIG. 13B, the obstacle can be effectively detected. That is, it is possible to accurately detect an obstacle and to control a vehicle so as to avoid collision and reducing damage. The driving support system of the vehicle 1200 recognizes the outside based on the distance information and images acquired by the distance measuring device 100 and controls the vehicle 1200. The distance measuring device 100 can acquire a color image having high color reproducibility and the distance information with high accuracy in which the influence of noise and chromatic aberration of the optical system is reduced. Therefore, even if the vehicle is traveling at night or in situations where objects having various colors (for example, cars, pedestrians, signs, and vehicle tail lamps) are present in urban areas, the outside can be recognized with high accuracy. Vehicle control for avoiding collision and reducing damage can be stably performed by performing robust recognition to the environmental changes of the outside.

According to the distance measuring device described above, it is possible to simultaneously acquire a color image having high color reproducibility and distance information with highly accuracy by using the imaging plane phase difference method.

Second Embodiment

Figure 14A:
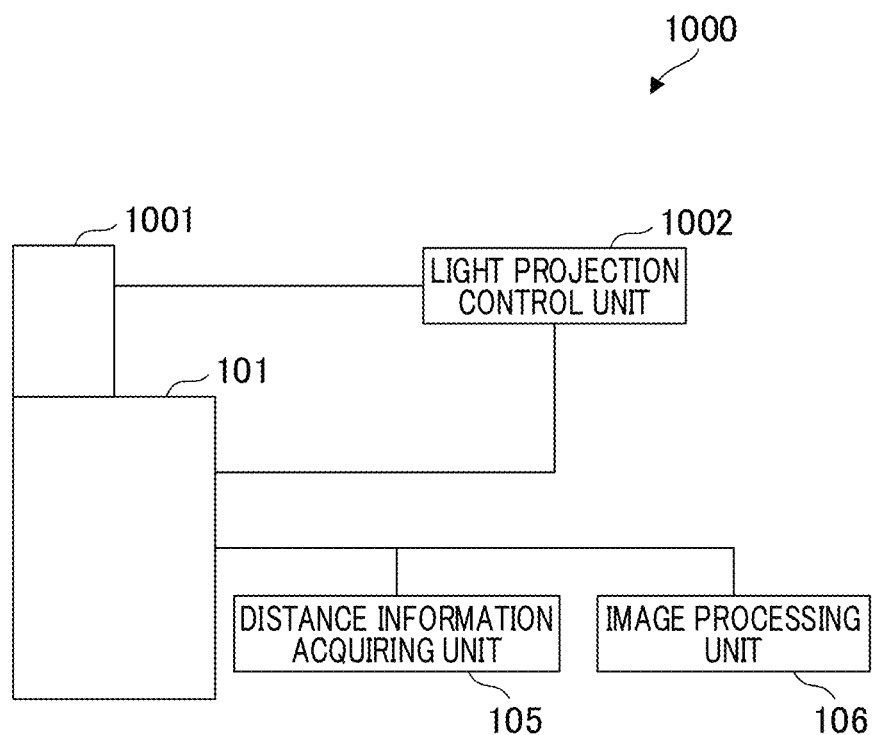
FIGS. 14A and 14B are explanatory diagrams of the distance measuring device according to the second embodiment.

Next, a second embodiment of the present invention will be described. FIG. 14A is a block diagram schematically illustrating a configuration of a distance measuring device 1000 according to the present embodiment. The distance measuring device 1000 includes the imaging unit 101, the distance information acquiring unit 105, the image processing unit 106, a pattern light projecting unit 1001, and a light projection control unit 1002.

The imaging unit 101, which has the configuration that is the same as that in the first embodiment, includes the imaging optical system 102 and the imaging element 103, and includes the optical filter 104 at the diaphragm position of the imaging optical system 102. The first region 104a in the optical filter 104 has the first spectral transmittance characteristic shown in A of FIG. 7, and the second region 104b and the third region 104c have the second spectral transmittance characteristic shown in B of FIG. 7.

The pattern light projecting unit 1001 includes a light source such as an LED (Light Emitting Diode), a projection optical system, and a pattern forming unit. The light source of the pattern light projecting unit 1001 emits light of the first wavelength and irradiates a pattern having a spatial bright-dark distribution to the object through the pattern forming unit. The pattern forming unit forms a pattern having a predetermined shape by using a pattern mask that has formed a pattern on, for example, a ground glass and a metal plate. An example of a pattern projected by the projection optical system is shown in FIG. 14B.

Figure 14B:
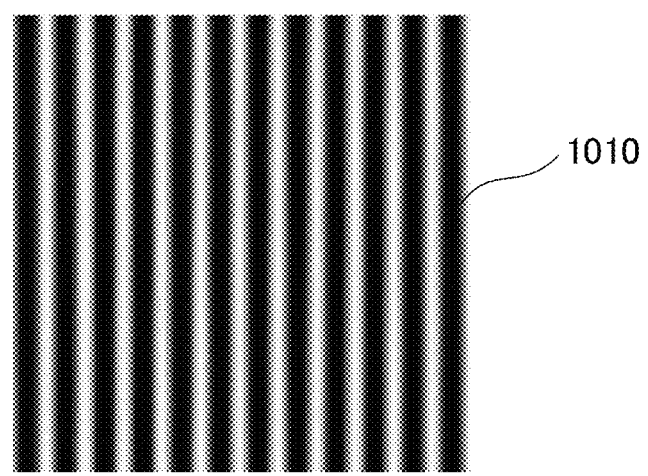

FIG. 14B illustrates a line-shaped pattern 1010. The wavelength band of light irradiated by the pattern light projecting unit 1001 is configured so as to substantially coincide with the high wavelength band of the second spectral transmittance (see 702 in B of FIG. 7). That is, the wavelength band of the irradiation light is a band that is longer than λ2 and shorter than λ6, and preferably longer than λ5 and shorter than λ6.

The light projection control unit 1002 controls the pattern light projecting unit 1001 so as to irradiate a pattern having a spatial bright-dark distribution in synchronization with imaging by the imaging unit 101. That is, the distance measuring device 1000 according to the present embodiment acquires an image captured in a state in which a pattern light is projected onto an object. A reflected light from an object to which a pattern light of the first wavelength is projected from the pattern light projecting unit 1001 is received by the imaging element 103 via the imaging optical system 102, and is photoelectrically converted into an image signal.

The imaging pixel portions 103a in the imaging element 103 receive light that has passed through the first region 104a in the optical filter 104. This light corresponds to the imaging light flux within the wavelength band from λ1 to λ2. Since the wavelength of the light emitted from the light source, in other words, the first wavelength, is longer than λ2, the influence of the pattern light irradiated from the pattern light projecting unit 1001 on the image acquired by the imaging pixel portions 103a is small.

In contrast, the two photoelectric conversion units provided in the distance measuring pixel portion 103b respectively receive light that have passed through the second region 104b and the third region 104c in the optical filter 104. This light corresponds to a pair of distance measuring light fluxes within the wavelength band from λ5 to λ6. The wavelength (first wavelength) of the light emitted from the light source is within a wavelength band, for example, from λ5 to λ6, and the distance measuring image pixel portions 103b acquire a pair of images in the case in which a pattern light is projected onto an object.

The presence of a region having a small luminance change along the first direction in a pair of images acquired by the distance measuring pixel portions 103b may cause a distance measurement error. This is because a corresponding point cannot be accurately detected during a detecting process of an amount of parallax shown in step S3 in FIG. 5A. In the present embodiment, the image of the object to which the pattern light has been projected can be acquired by the distance measuring pixel portions 103b by the wavelength of the light projected by the pattern projecting unit 1001 being made the first wavelength. As a result, a distance measurement error can be reduced by reducing a region having a small luminance change along the first direction.

If the surrounding environment of the imaging unit 101 is recognized by using machine learning and the like, it is desirable that the spatial luminance change in the acquired image is caused by the reflectance of an object. That is, recognition accuracy increases by acquiring an image in the case where a spatially uniform illumination light is irradiated to an object. In the distance measuring device according to the present embodiment, the pattern light projecting unit 1001 irradiates a pattern light of the first wavelength, and the transmittance of the first wavelength in the first region 104a in the optical filter 104 is low. As a result, with regard to the image acquired by the imaging pixel portions 103a, the influence of the pattern light due to the pattern light projecting unit 1001 is reduced. Therefore, it is possible to simultaneously acquire an image that can faithfully reproduce the luminance and color of the object and distance information with high accuracy that does not depend on the luminance change of the object.

The line-shaped pattern 1010 shown in FIG. 14B is an example of a bright-dark pattern formed by the pattern light projecting unit 1001, and another bright-dark pattern that is different from this may be used. The pattern to be projected is preferably a line-shaped pattern in which a bright region and a dark region extend in a direction perpendicular to the first direction. The reason is that if the projection pattern tilts toward the direction perpendicular to the first direction, spatial frequency components in the first direction included in the pair of images used for acquiring distance information are reduced, and the calculation accuracy of the parallax amount decreases. The angle between the first direction and the direction in which the bright region of the projection pattern extends is preferably 60 degrees or more, more preferably 80 degrees or more.

The light projected by the pattern light projecting unit 1001 may have a predetermined wavelength width centered on the first wavelength. In that case, it is desirable that the lower limit and the upper limit of the wavelength width of the light is contained within the range from $\lambda5$ to $\lambda6$. Note that if the second spectral transmittance in the optical filter 104 according to the present embodiment has the spectral transmittance characteristics shown in B of FIG. 2, the first wavelength, which is the wavelength of the light projected by the pattern light projecting unit 1001, may be within the wavelength band from $\lambda2$ to $\lambda4$.

Application Example of the Second Embodiment

Figure 15:
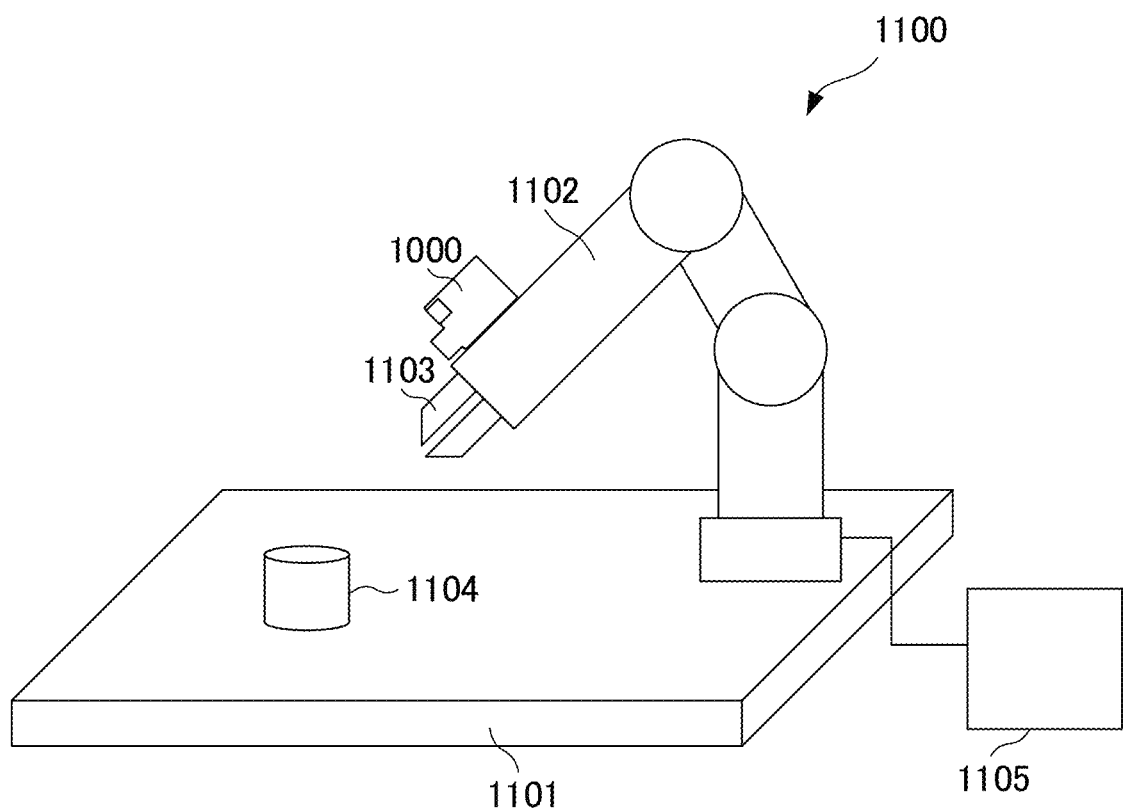
FIG. 15 illustrates a robot device including the distance measuring device according to the second embodiment.

The distance measuring device according to the present embodiment can be applied to a robot device for production operation. FIG. 15 is an explanatory diagram of a robot device including the distance measuring device according to the present embodiment. A robot device 1100 is an articulated robot including a base 1101 and a robot arm 1102. A robot hand 1103 is attached to the distal end portion of the robot arm 1102. The robot hand 1103 is an end effector for performing an operation that grips a workpiece 1104 and attaching it to another part.

In the distance measuring device 1000 according to the present embodiment, the workpiece 1104 is fixed at a position in the vicinity of the distal end portion of the robot arm 1102 such that the workpiece 1104 is contained within the imaging angle of view. A control unit 1105 controls, for example, the distance measuring device 1000, the robot arm 1102, and the robot hand 1103. The control apparatus 1105 is configured by a computer, hardware, and a circuit, and executes a software process. The control apparatus 1105 has a calculation unit and a control unit. The calculation unit estimates the position and orientation of the workpiece 1104, and calculates a driving amount of the robot arm 1102 and the robot hand 1103 based on the distance information and the image acquired by the distance measuring device 1000. The control unit performs drive control of the robot arm 1102 and the robot hand 1103 based on the timing of transmitting a measurement command to the distance measuring device 1000 and a calculation result by the calculation unit.

In the production process using the robot device 1100, the control apparatus 1105 transmits a moving command to the robot arm 1102 via a communication path in order to grip the workpiece 1104 disposed on the base 1101 by using the robot hand 1103. Control that moves the robot hand 1103 close to the workpiece 1104 is performed. At this time, since the position and orientation of the workpiece 1104 is indefinite, before the robot hand 1103 grips the workpiece 1104, the distance measuring device 1000 shoots the workpiece 1104 and acquires the image and the distance information.

The calculation unit in the control apparatus 1105 calculates the position and orientation of the workpiece 1104 based on the image and distance information acquired from the distance measuring device 1000. The calculation unit further calculates a moving amount of the robot arm 1102 based on the position and orientation information of the workpiece 1104. The control unit in the control apparatus 1105 acquires the data of the moving amount after calculation and transmits a movement command corresponding to the moving amount after calculation to the robot arm 1102. Accordingly, the robot arm 1102 moves to a position suitable for gripping the workpiece 1104. After completion of the movement of the robot arm 1102, the control unit transmits a command to the robot hand 1103 to close a finger portion (grip portion). The robot hand 1103 grips the workpiece 1104 in accordance with the instruction. The control unit moves the robot arm 1102 to a predetermined position in order to assemble the workpiece 1104 gripped by the robot hand 1103 to a component (not illustrated) and transmits an instruction to open the finger portion of the robot hand 1103 after movement. By performing these operations repeatedly, the assembly work by the robot device 1100 is performed.

In many cases, the surface of a general workpiece 1104 has no pattern. According to the present embodiment, distance measurement with high accuracy can be performed by shooting in a state in which a pattern light is projected by the pattern light projecting unit 1001, and a projection light having a bright-dark striped pattern is superimposed on the surface of the workpiece 1104. Furthermore, according to the present embodiment, it is possible to perform distance measurement with high accuracy regardless of the color of the workpiece 1104 by reducing the influence of the chromatic aberration of the imaging optical system 102.

The distance measuring device 1000 according to the present embodiment can acquire an image in which the influence of the pattern light projected on the workpiece 1104 is reduced. As a result, it is possible to acquire the image of the end portion of the workpiece 1104 detected from the image and the distance information of the workpiece 1104 by one shooting. The position and orientation of the workpiece 1104 can be calculated with high accuracy and with a smaller number of man-hours by comparing the acquired image and the distance information to the shape information of the work stored in the control unit 1105.

According to the present embodiment, although an LED is exemplified as the light source of the pattern light projecting unit 1001, the present invention is not limited thereto, and an LD (Laser Diode) may be used. Additionally, a reflective or transmissive LCOS (Liquid Crystal On Silicon) or DMD (Digital Micromirror Device) may be used for the pattern forming portion. The cycle of the projection pattern can be changed in a timely manner in accordance with the size and the distance of the object, and distance measurement with higher accuracy can be performed depending on the situation.

The technical scope of the present invention encompasses embodiments in which the components of the distance measuring device are arbitrarily combined and includes a computer program in addition to the distance measuring device. The computer program causes the computer to execute a predetermined process in order to calculate the distance or the parallax amount. For example, the computer program is installed in an imaging apparatus such as a distance measuring device or a digital camera equipped with the distance measuring device, realizes the above functions by being executed by a computer, and enables distance measurement at a higher speed and with higher accuracy.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-059938, filed Mar. 27, 2018, which is hereby incorporated by reference wherein in its entirety.

What is claimed is:

1. A distance measuring device comprising:
an optical filter having a first region having a first spectral transmittance characteristic and a second region and a third region having a second spectral transmittance characteristic in which light having a longer wavelength compared to the first spectral transmittance characteristic is transmitted;
a first photoelectric conversion unit configured to be provided in a first pixel portion that configures an imaging element, receive light that has passed through the first region of the optical filter, and output an image signal;
second and third photoelectric conversion units configured to be provided in a second pixel portion that configures the imaging element, receive light that has passed through the second and third regions of the optical filter, and output signals corresponding to light component having the longer wavelength; and
at least one processor and memory holding a program that makes the processor function as:
an acquiring unit configured to acquire distance information corresponding to the parallax of image data based on signals output from each of the second and third photoelectric conversion units.

2. A distance measuring device comprising:
an optical filter having a first region having a first spectral transmittance characteristic and a second region and a third region having a second spectral transmittance characteristic in which light having a longer wavelength compared to the first spectral transmittance characteristic is transmitted;
a first photoelectric conversion unit configured to be provided in a pixel portion that configures an imaging element, receive light that has passed through the first region of the optical filter, and output an image signal;
second and third photoelectric conversion units configured to be provided in the pixel portion that configures the imaging element, receive light that has passed through the second and third regions of the optical filter, and output signals corresponding to light component having the longer wavelength; and
at least one processor and memory holding a program that makes the processor function as:
an acquiring unit configured to acquire distance information corresponding to the parallax of image data based on signals output from each of the second and third photoelectric conversion units.

3. The distance measuring device according to claim 2, wherein the first region has the first spectral transmittance characteristic in which light from the first wavelength to the second wavelength is transmitted and the second and third regions have the second spectral transmittance characteristic in which light from the third wavelength to the fourth wavelength is transmitted, and
wherein the first wavelength is shorter than the third wavelength and the second wavelength is shorter than the fourth wavelength.

4. The distance measuring device according to claim 2, wherein the first region has the first spectral transmittance characteristic in which light from the first wavelength to the second wavelength is transmitted and the second and third regions have the second spectral transmittance characteristic in which light from the third wavelength to the fourth wavelength is transmitted, and
wherein the second wavelength is shorter than the third wavelength.

5. The distance measuring device according to claim 3, wherein the third wavelength is 450 nm or more, or the fourth wavelength is 1100 nm or less.

6. The distance measuring device according to claim 3, further comprising a light projecting unit configured to irradiate light of a pattern having a spatial bright-dark distribution to an object,
wherein the wavelength of light irradiated by the light projecting unit is longer than the second wavelength and shorter than the fourth wavelength.

7. The distance measuring device according to claim 2, wherein the optical filter is disposed at a diaphragm position between a first lens and a second lens configuring an imaging optical system.

8. The distance measuring device according to claim 2 comprising:

a generating unit configured to generate first image data for imaging based on the image signal output from the first photoelectric conversion unit and generate each of second and third image data based on the signals output from the second and third photoelectric conversion units, wherein the acquiring unit acquires distance information corresponding to the parallax between the second image data and the third image data.

9. A robot device comprising:

a distance measuring device; and a robot arm, a robot hand, and a control unit, the distance measuring device comprising:

an optical filter having a first region having a first spectral transmittance characteristic and a second region and a third region having a second spectral transmittance characteristic in which light having a longer wavelength compared to the first spectral transmittance characteristic is transmitted;

a first photoelectric conversion unit configured to be provided in a pixel portion configuring an imaging element, receive light that has passed through the first region of the optical filter, and output an image signal;

second and third photoelectric conversion units configured to be provided in a second pixel portion that configures the imaging element, receive light that has passed through the second and third regions of the optical filter, and output signals corresponding to light component having the longer wavelength; and an acquiring unit configured to acquire distance information corresponding to the parallax of image data based on signals output from each of the second and third photoelectric conversion units, wherein the control unit calculates position and orientation of a target object by using an image and the distance information obtained by the distance measuring device to control the robot arm or the robot hand.

* * * * *